(12) United States Patent
Lee et al.

(10) Patent No.: US 12,405,478 B2
(45) Date of Patent: Sep. 2, 2025

(54) APPARATUS FOR LASER ANNEALING AND OPERATING METHOD THEREOF

(71) Applicant: SAMSUNG ELECTRONICS CO., LTD., Suwon-si (KR)

(72) Inventors: Sangmin Lee, Yongin-si (KR); Seulgi Lee, Cheongju-si (KR); Sungwook Jung, Seoul (KR); Hyukjun Kwon, Uiwang-si (KR); Hyangrok Lee, Anyang-si (KR)

(73) Assignees: EO TECHNICS CO., LTD, Anyang-si (KR); Samsung Electronics Co., Ltd., Suwon-si (KR)

( * ) Notice: Subject to any disclaimer, the term of this patent is extended or adjusted under 35 U.S.C. 154(b) by 608 days.

(21) Appl. No.: 17/580,708

(22) Filed: Jan. 21, 2022

(65) Prior Publication Data

US 2023/0047722 A1 Feb. 16, 2023

(30) Foreign Application Priority Data

Aug. 11, 2021 (KR) ........................ 10-2021-0105958

(51) Int. Cl.
*G02B 27/09* (2006.01)
*B23K 26/00* (2014.01)
(Continued)

(52) U.S. Cl.
CPC ...... *G02B 27/0905* (2013.01); *B23K 26/0006* (2013.01); *B23K 26/009* (2013.01); *B23K 26/0648* (2013.01); *B23K 26/0652* (2013.01); *B23K 26/0676* (2013.01); *G02B 3/0062* (2013.01); *G02B 27/0972* (2013.01); *G02B 27/106* (2013.01); *G02B 27/144* (2013.01); *G02B 27/146* (2013.01); *G02B 27/283* (2013.01); *G02B 27/286* (2013.01); *B23K 2103/56* (2018.08); *H01L 21/67115* (2013.01)

(58) Field of Classification Search
None
See application file for complete search history.

(56) References Cited

U.S. PATENT DOCUMENTS 8,569,814 B2 10/2013 Nishida et al.
8,770,763 B2 7/2014 Murayama et al.
(Continued)

FOREIGN PATENT DOCUMENTS

CN 207895096 U * 9/2018
CN 109676244 A * 4/2019 .......... B23K 26/064
(Continued)

OTHER PUBLICATIONS

Machine translation of JP-5046778-B2, Oct. 2024 (Year: 2024).*
(Continued)

*Primary Examiner* — Geoffrey S Evans
(74) *Attorney, Agent, or Firm* — Fish & Richardson P.C.

(57) ABSTRACT

A method of operating an apparatus for laser annealing, includes reducing temporal or spatial coherency of a plurality of laser beams by beam superimposing; and reducing an electric field inner product magnitude of beams having the reduced temporal or spatial coherency by a fly eye lens array to reduce coherency, and/or by modifying a polarization state between the beams by beam superimposing.

10 Claims, 30 Drawing Sheets

(51) Int. Cl.
  *B23K 26/06*     (2014.01)
  *B23K 26/064*    (2014.01)
  *B23K 26/067*    (2006.01)
  *G02B 3/00*      (2006.01)
  *G02B 27/10*     (2006.01)
  *G02B 27/14*     (2006.01)
  *G02B 27/28*     (2006.01)
  *B23K 103/00*    (2006.01)
  *H01L 21/67*     (2006.01)

(56) References Cited

U.S. PATENT DOCUMENTS

| | | |
|---|---|---|
| 8,902,506 B2 | 12/2014 | Mizuyama et al. |
| 9,341,858 B2 | 5/2016 | Moffatt |
| 9,602,780 B2 | 3/2017 | Ito et al. |
| 2006/0126184 A1 | 6/2006 | Kim et al. |
| 2009/0061603 A1* | 3/2009 | Shimoto ............ B23K 26/0676 438/487 |
| 2012/0080411 A1 | 4/2012 | Mizuyama |
| 2014/0192533 A1 | 7/2014 | Moffatt |
| 2014/0256161 A1* | 9/2014 | Li ................... B23K 26/352 438/795 |
| 2015/0037984 A1* | 2/2015 | Zhang ................ B23K 26/067 438/799 |
| 2016/0035603 A1* | 2/2016 | Ikenoue ............ B23K 26/354 219/121.65 |
| 2019/0172713 A1* | 6/2019 | Sangu ............... H01L 27/1222 |
| 2020/0176954 A1* | 6/2020 | Whitmore ............ H01S 5/0233 |
| 2021/0138581 A1 | 5/2021 | Cho et al. |
| 2022/0184734 A1* | 6/2022 | Ohmori ............ B23K 26/0622 |
| 2023/0004094 A1* | 1/2023 | Mizuno ............ B23K 26/362 |
| 2023/0069985 A1* | 3/2023 | Sung ............... B23K 26/0622 |

FOREIGN PATENT DOCUMENTS

| | | |
|---|---|---|
| JP | 3860444 A | 3/2003 |
| JP | 2004-356282 A | 12/2004 |
| JP | 2007-027612 A | 2/2007 |
| JP | 2010-224311 | 10/2010 |
| JP | 5046778 B2 * | 10/2012 |
| KR | 10-2009-0028625 | 3/2009 |
| KR | 10-2015-0133697 | 11/2015 |
| KR | 10-2017-0102072 | 9/2017 |
| WO | WO 2007/141185 | 12/2007 |
| WO | WO-2007141185 A2 * | 12/2007 ......... B23K 26/0604 |
| WO | WO-2014156818 A1 * | 10/2014 ......... B23K 26/0006 |

OTHER PUBLICATIONS

Machine translation of CN-207895096-U, Oct. 2024 (Year: 2024).*
Machine translation of CN-109676244-A, Apr. 2025 (Year: 2025).*
Machine translation of WO-2014156818-A1, Apr. 2025 (Year: 2025).*
Notice of Third Party Observation in Korean Appln. No. 10-2021-0105958, mailed on Mar. 25, 2024, 2 pages.

* cited by examiner

<Part B>

APPARATUS FOR LASER ANNEALING AND OPERATING METHOD THEREOF

CROSS-REFERENCE TO RELATED APPLICATION(S)

This application claims benefit of priority to Korean Patent Application No. 10-2021-0105958 filed on Aug. 11, 2021 in the Korean Intellectual Property Office, the disclosure of which is incorporated herein by reference in its entirety.

BACKGROUND

The present inventive concept relates to an apparatus for laser annealing and an operating method thereof.

In general, a semiconductor device may be formed by a plurality of individual processes. The individual processes may include a thin film deposition process, a photolithography process, an etching process, an ion implantation process, and an annealing process. From all these individual processes, the annealing process may be a process of stabilizing a substrate or a thin film on the substrate or for melting the substrate to remove seaming defects in the thin film. For example, the annealing process may include a rapid heat treatment process, and a laser annealing process.

SUMMARY

An aspect of the present inventive concept is to provide an apparatus for reducing beam noise caused by coherency of a laser in an annealing apparatus using the laser as a light source, and an operating method thereof.

According to an aspect of the present inventive concept, an apparatus for laser annealing includes a light source generating a plurality of laser beams; a time division superimposing device temporally branching the plurality of laser beams, respectively, to propagate branched beams onto different optical paths, and superimposing beams emitted from the same laser, from the branched beams propagated onto different optical paths; a space split superimposing device spatially branching superimposed beams passing through the time division superimposing device or the plurality of laser beams, respectively, to propagate beams emitted from different lasers onto the same path, to superimpose the propagated beams emitted from the different lasers; an optical illumination system forming flat-top beams homogenizing intensities of superimposed beams passing through the space split superimposing device; a mask passing homogenized beams from the flat-top beams formed by passing through the optical illumination system; and an optical imaging system imaging each of the homogenized beams passing through the mask onto a wafer.

According to an aspect of the present inventive concept, a method of operating an apparatus for laser annealing, includes reducing temporal or spatial coherency of a plurality of laser beams by beam superimposing; and reducing an electric field inner product magnitude of beams having the reduced temporal or spatial coherency by a fly eye lens array to reduce coherency, by modifying a polarization state between the beams by beam superimposing According to an aspect of the present inventive concept, an apparatus for laser annealing includes a stage accommodating a wafer; a light source generating a plurality of laser beams projected onto the wafer; an optical illumination system illuminating the plurality of laser beams on to a mask; and an optical imaging system imaging beams passing through the mask onto the wafer, wherein the optical illumination system comprises a plurality of fly eye lens arrays homogenizing intensity of each of the plurality of laser beams, and wherein at least one of the plurality of fly eye lens arrays are configured by intersecting a material having a light activation property and a material having no light activation property.

According to an aspect of the present inventive concept, an apparatus for laser annealing includes a light source generating a plurality of laser beams; at least one fly eye lens array discretizing the plurality of laser beams; a polarization controller making polarization states of adjacent beams passing through the at least one fly eye lens array orthogonal to each other; an optical illumination system forming flat-top beams homogenizing intensities of beams passing through the at least one fly eye lens; a mask passing homogenized beams among the flat-top beams formed by passing through the optical illumination system; and an optical imaging system imaging each of the homogenized beams passing through the mask onto a wafer.

According to an aspect of the present inventive concept, an apparatus for laser annealing includes a light source generating a plurality of laser beams; a time division superimposing device temporally branching the plurality of laser beams, respectively, to propagate branched beams onto different optical paths, and superimposing beams propagated from the different optical paths; an optical illumination system forming flat-top beams homogenizing intensities of superimposed beams passing through the time division superimposing device; a mask passing homogenized beams among the flat-top beams formed by passing through the optical illumination system; and an optical imaging system imaging each of the homogenized beams passing through the mask onto a wafer.

According to an aspect of the present inventive concept, an apparatus for laser annealing includes a light source generating a plurality of laser beams; a space split superimposing device spatially branching the plurality of laser beams, respectively, to propagate beams emitted from different lasers onto the same path, to superimpose the propagated beams emitted from the different lasers; an optical illumination system forming flat-top beams homogenizing intensities of superimposed beams passing through the space split superimposing device; a mask passing homogenized beams from the flat-top beams formed by passing through the optical illumination system; and an optical imaging system imaging each of the homogenized beams passing through the mask onto a wafer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, the present inventive concept will be described clearly and in such detail, using the drawings to the extent that those of ordinary skill in the art may easily implement it.

Figure 1:
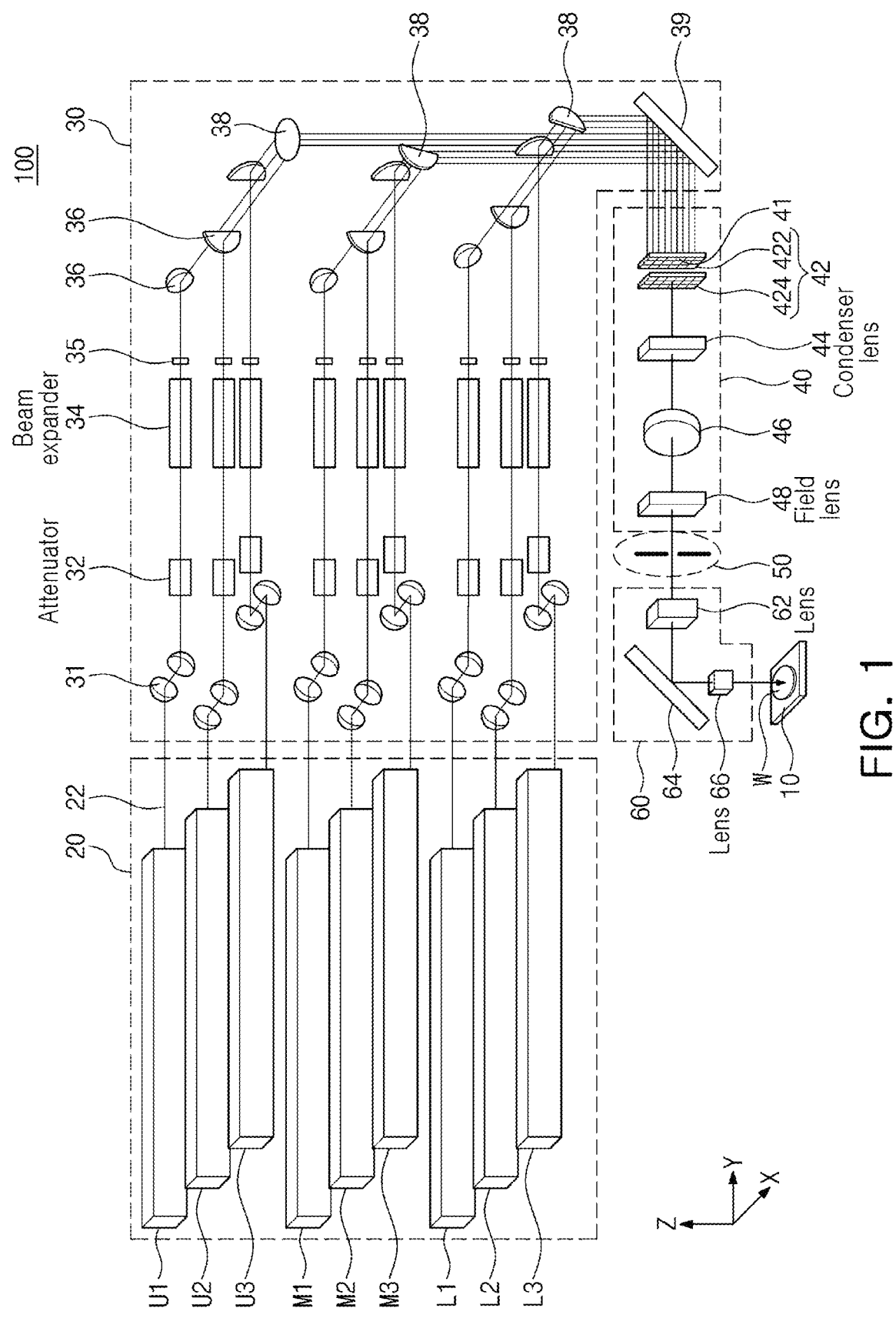
FIG. 1 is a view illustrating a general apparatus 1 for laser annealing.

FIG. 1 is a view illustrating a general apparatus 1 for laser annealing. Referring to FIG. 1, an apparatus 1 for laser annealing may include a stage 10, a light source 20, an optical delivery system 30, a homogenizing system 40, a mask 50, and an optical imaging system 60.

The stage 10 may accommodate a substrate W. The stage 10 may move the substrate W in a first direction X and a second direction Y. In this case, the first direction X and the second direction Y may be perpendicular to each other. The light source 20 may generate laser beams 22, and may provide the laser beams 22 to the substrate W. Each of the laser beams 22 may include a continuous wave laser beam or a pulse wave laser beam. For example, the light source 20 may include a plurality of laser units (e.g., nine (9) lasers in FIG. 1). For example, the light source 20 may include first to third lower laser light sources L1, L2, and L3, first to third intermediate laser light sources M1, M2, and M3, and first to third upper laser light sources U1, U2, and U3. The first to third lower laser light sources L1, L2, and L3 may be arranged in the first direction X. The optical delivery system 30 may be disposed between the light source 20 and the stage 10. The optical delivery system 30 may deliver the laser beams 22 to the homogenizing system 40. In an exemplary embodiment, the optical delivery system 30 may include first delivery mirrors 31, attenuators 32, beam expanders 34, phase shifters 35, second delivery mirrors 36, third delivery mirrors 38, and a fourth delivery mirror 39. The homogenizing system 40 may be disposed between the fourth delivery mirror 39 of the optical delivery system 30 and the stage 10. The homogenizing system 40 may homogenize the laser beams 22 by mixing them. As an example, the homogenizing system 40 may include array lenses 42, a condenser lens 44, a shutter 46, and a field lens 48.

As shown in FIG. 1, the optical imaging system 60 includes a lens 62, a mirror 64, and a lens 66.

The general apparatus 1 for laser annealing is expected to improve distribution and uniformity of laser beams by increasing the number of lasers. However, an increase in the number of such laser beams may place a burden on equipment requirements in preparation for the improvement desired.

In addition, when the light source is a laser having coherency, speckle noise generated by an interference phenomenon may impair uniformity of laser beams. As a result, energy required for an actual process may not be uniformly delivered to the wafer, and thus a local defect may occur while the wafer is annealed. In general, in a laser having a pulse rate of 100 Hz or less, the interference phenomenon may be reduced by superimposing 10 or more pulses for a predetermined time. However, in a process in which wafer melting annealing is performed for a short time of 100 ns or less, a high-power pulsed laser having a pulse rate of 10 MHz or more may be required to superimpose pulses during a process period. Because of this, it may be impossible to reduce this interference phenomenon. Alternatively, the pulses may be superimposed by synchronizing laser pulses emitted from each of the lasers. However, it is practically impossible to install dozens of high-power lasers in a facility.

Figure 2:
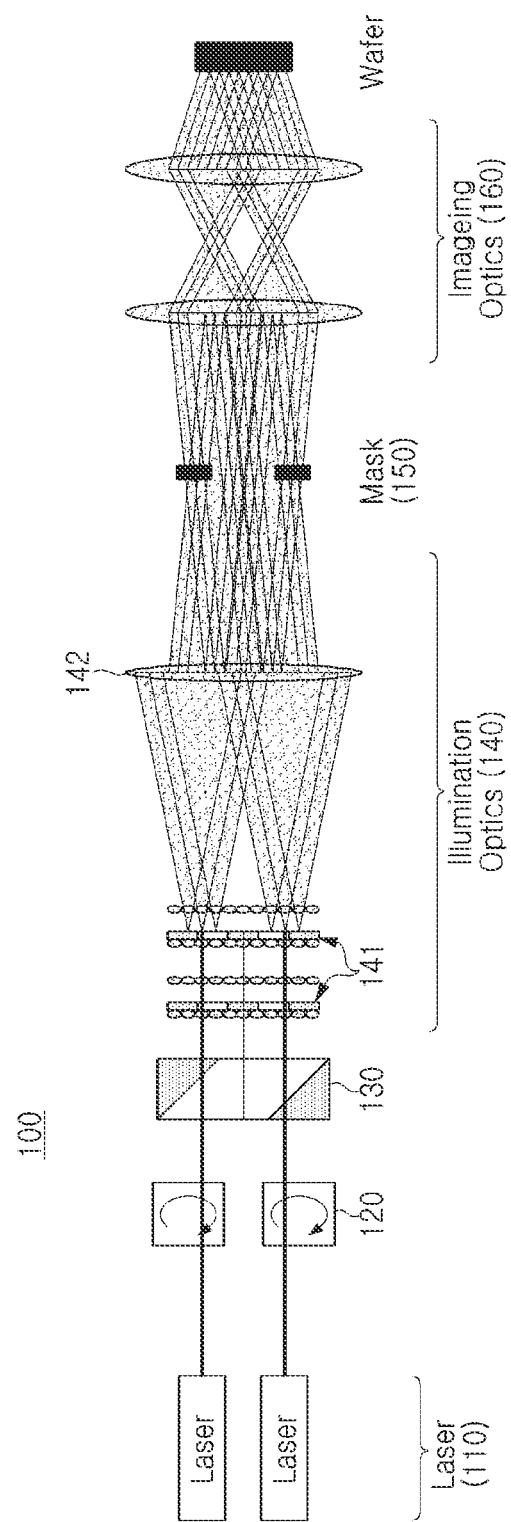
FIG. 2 is a view illustrating an apparatus 100 for laser annealing according to an exemplary embodiment of the present inventive concept.

FIG. 2 is a view illustrating an apparatus 100 for laser annealing according to an exemplary embodiment of the present inventive concept. Referring to FIG. 2, an apparatus 100 for laser annealing may include a plurality of pulsed laser light sources 110, a time division superimposing device 120, a space split superimposing device 130, an optical illumination system 140, a mask 150, and an optical imaging system 160.

The time division superimposing device 120 may be implemented to reduce coherent noise by temporally branching pulses of lasers, respectively, propagating branched pulses onto different optical paths, and superimposing propagated pulses.

The space split superimposing device 130 may be implemented to reduce coherent noise by spatially branching pulses of lasers, respectively, propagating branched pulses onto the same path as different laser pulses, and superimposing propagated pulses.

The optical illumination system 140 may be implemented to spatially uniformly illuminate the intensity distribution of laser beams emitted from each of the lasers to the mask 150. Also, the optical illumination system 140 may include a beam polarization controller 141 and a lens 142. The beam polarization controller 141 may be implemented to reduce coherent noise by forming polarization states of beams passing through a fly eye lens orthogonal to each other. In an exemplary embodiment, the fly eye lens of the optical illumination system 140 may be made of a Z-cut crystal quartz having light activation characteristics to orthogonalize the polarization states of the passing beams.

The mask 150 may be implemented such that only a portion having a uniform illumination region intensity is delivered and imaged onto a surface of the wafer by the optical imaging system 160. The imaged mask-shaped beams may include a flat-top beam with sharp edges. An annealing process may be advantageously performed using such beams.

An apparatus 100 for laser annealing according to an exemplary embodiment of the present inventive concept may reduce coherency by time and/or space split superimposition of lasers, and may control a polarization state to suppress the occurrence of interference, to greatly improve noise due to coherency.

In general, since illumination by an optical illumination system has a very high degree of steepness in an edge portion of beams, when directly used for wafer annealing, there is a possibility of occurrence of defects in the edge portion of the beams. Therefore, a mask is required to form flat-top beams having sharp edges and uniform flat-top beams.

Figure 3A:
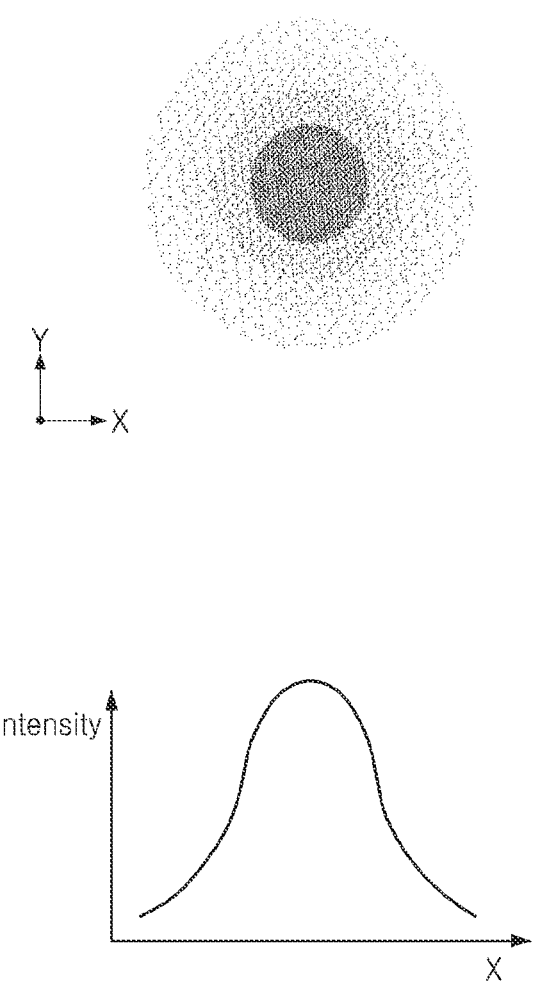
FIGS. 3A, 3B and 3C are views illustrating intensities of beams on a laser position, a mask position, and a wafer position.
Figure 3B:
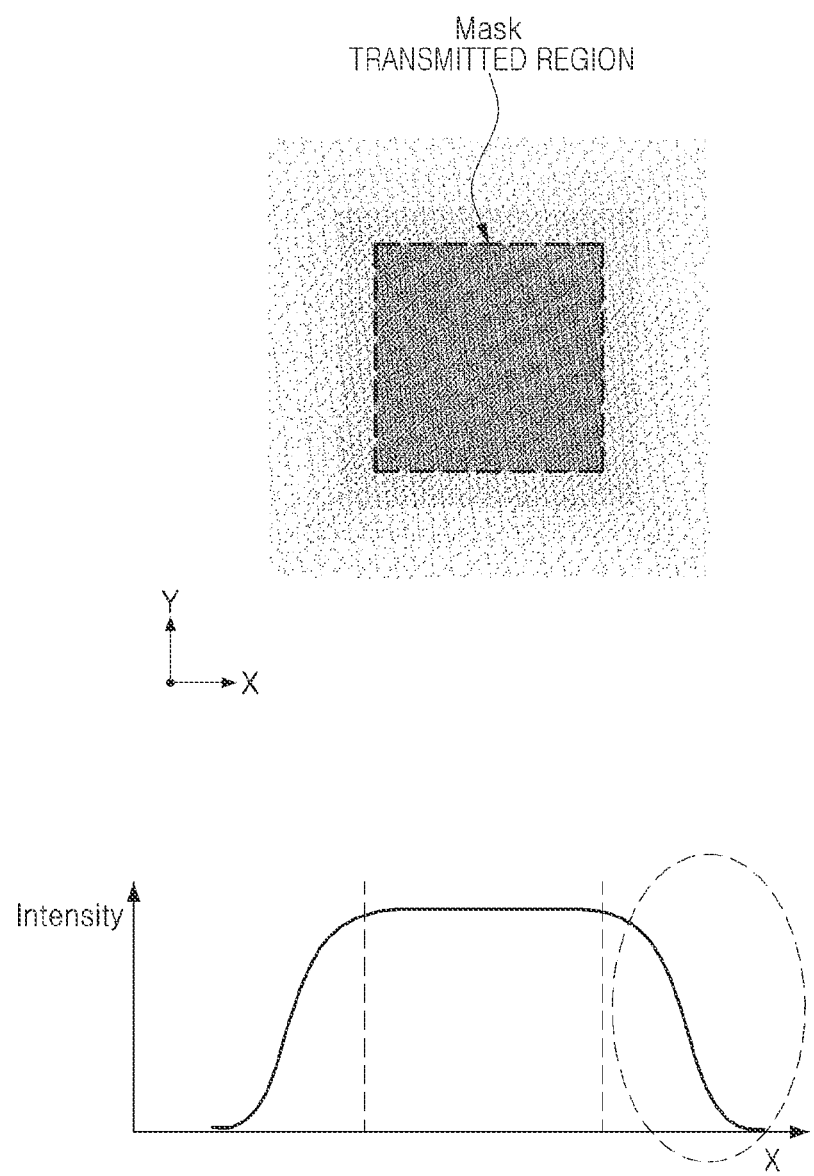
Figure 3C:
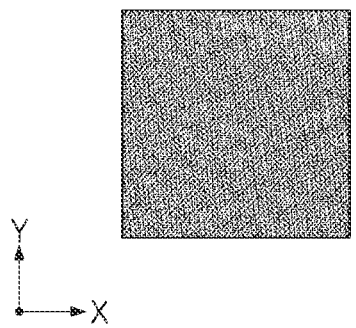
Figure 3C:
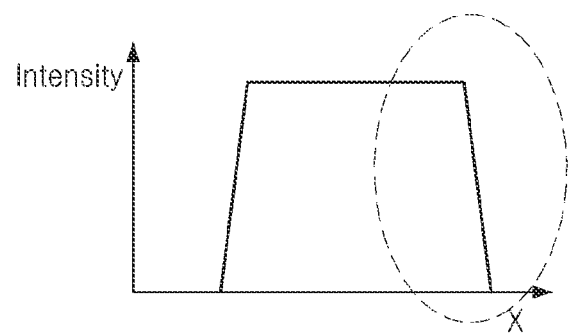

FIGS. 3A, 3B and 3C are views illustrating intensities of beams on a laser position, a mask position, and a wafer position. As illustrated in FIG. 3A, laser beams incident on a fly eye lens 141 exhibit Gaussian distribution characteristics. As illustrated in FIG. 3B, an edge portion of beams may be blocked by placing an appropriate mask.

As illustrated in FIG. 3C, flat-top beams delivered to a wafer by a mask may be delivered.

An apparatus 100 for laser annealing according to an embodiment of the present inventive concept may include an optical illumination system 140 using a plurality of high-power ns pulse lasers as a light source, a mask 150, and an optical imaging system 160. To minimize noise due to a laser interference phenomenon, coherency κ may be reduced by superimposing beams temporally/spatially, an electric field inner product magnitude E1·E2 of the beams may be minimized by modifying a polarization state between the beams discretized by a fly eye lens. In this case, noise having interference fringe may be expressed by the following Equation 1.

$$\text{Coherent Nosie} = \text{Constant} + 2\kappa(E1 \cdot E2)^* \cos(2\pi y/\Lambda) \quad \text{[Equation 1]}$$

In this case, κ is a coherency index, E1 is an electric field intensity of a first beam, E2 is an electric field intensity of a second beam, and Λ is a period of an interference fringe.

In general, coherency, one of basic characteristics of lasers, may be the cause of noise during beam shaping using a homogenizer. A pulsed laser may also have coherency within a single pulse and may cause noise, but when multiple pulses superimpose, coherency may be reduced. As an example, as the number of pulses increases, the coherency κ may decrease.

Figure 4A:
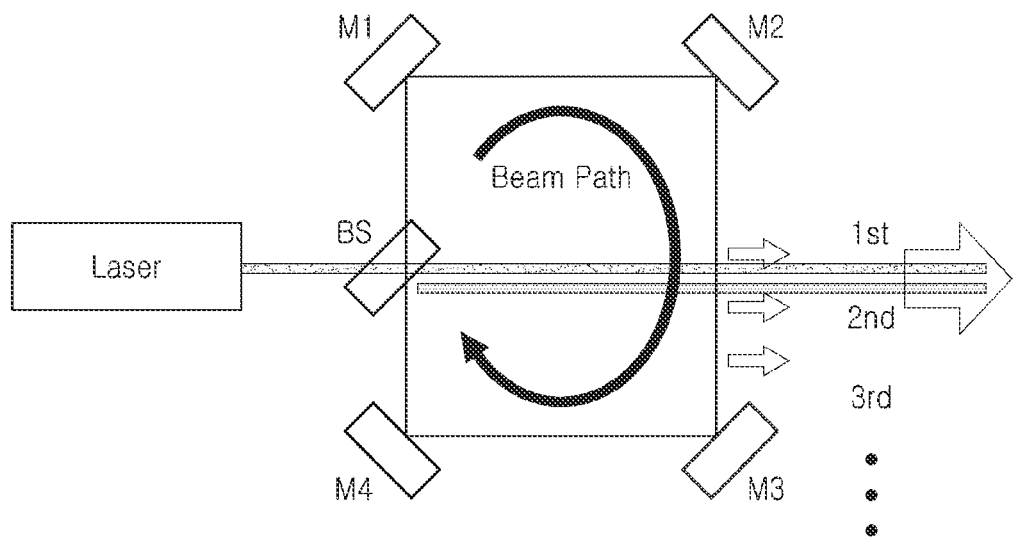
FIGS. 4A and 4B are views illustrating an operating method of a pulse time division superimposing device 120 according to an exemplary embodiment of the present inventive concept.
Figure 4B:
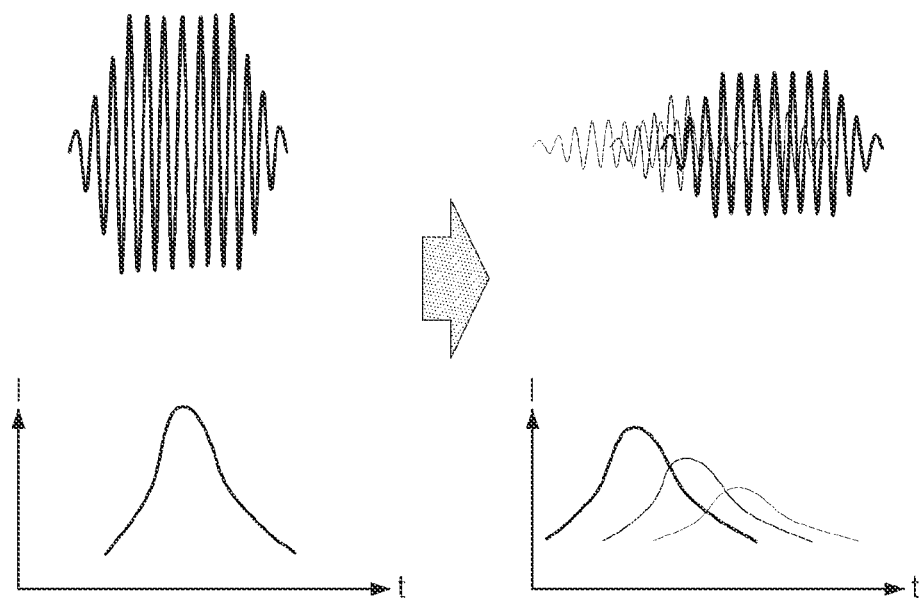

FIGS. 4A and 4B are views illustrating an operating method of a pulse time division superimposing device 120 according to an exemplary embodiment of the present inventive concept. As illustrated in FIG. 4A, a time division superimposing method may use a beam splitter BS having a reflectance (R) and a transmittance (T) for a laser beam, such that a beam corresponding to T % of an original beam is transmitted ($1^{st}$) to propagate the beam onto an existing optical path, and a beam corresponding to R % of the original beam is reflected and again introduced into the beam splitter BS using a plurality of mirrors M1, M2, M3, and M4, to reflect in R % to propagate the beam into the existing optical path ($2^{nd}$). Thereafter, T % is transmitted and again introduced into the beam splitter BS using the plurality of mirrors M1, M2, M3, and M4, and the above-described phenomena is repeated.

For example, when using a beam splitter BS having a reflectance and transmittance in a ratio of 50:50, assuming that an original number of beams emitted from a laser is 1, a first beam may have an amount of light corresponding to ½, a second beam may have an amount of light corresponding to ¼, and a third beam may have an amount of light corresponding to ⅛. As illustrated in FIG. 4B, the first beam, the second beam, and the third beam may superimpose in and be propagated into an existing optical path with a predetermined time delay. The second beam may be delayed by a time corresponding to L/c (where, L: beam path, c: speed of light), relative to the first beam, and the third beam may be delayed by a time corresponding to 2L/c, relative to the first beam. According to this principle, while one pulse may be temporally branched and superimposed repeatedly, the effect of superimposing a plurality of pulses may be realized. Thereby, reducing coherent noise.

In an exemplary embodiment, the plurality of mirrors M1 to M4 may include a first mirror M1 reflecting a beam, reflected from the beam splitter BS, in a first direction, a second mirror M2 reflecting a beam, reflected from the first mirror M1, in the second direction, a third mirror M3 reflecting a beam, reflected from the second mirror M2, in a direction opposite to the first direction, and a fourth mirror M4 reflecting a beam, reflected from the third mirror M3, in a direction opposite to the second direction, to be incident on the beam splitter BS.

When a plurality of lasers are used, the above-described time division superimposing method may be applied to each of the lasers. Therefore, pulses may respectively increase, but an interval between pulses of the plurality of lasers may be adjusted, to make the final combined pulse shape similar to an existing combined pulse shape.

Figure 5A:
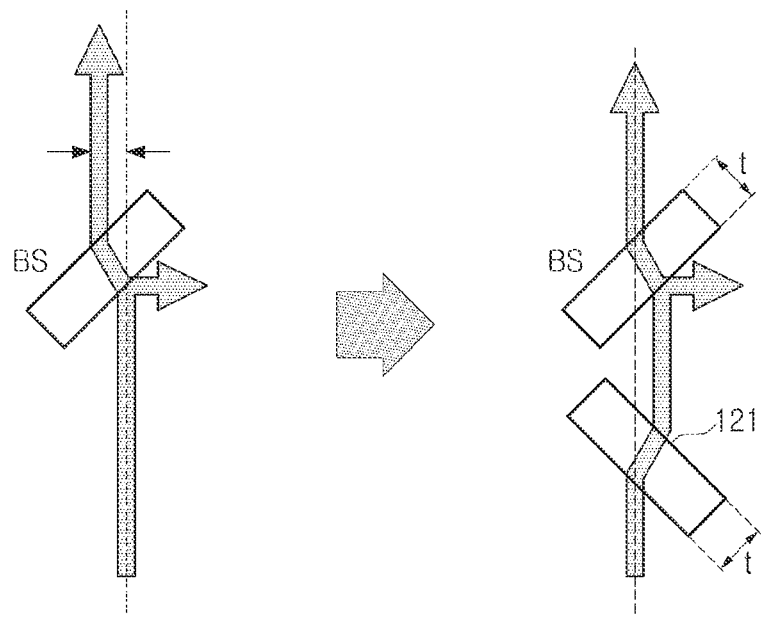
FIG. 5A is a view illustrating a beam movement effect by a beam splitter (BS) according to an exemplary embodiment of the present inventive concept.
Figure 5B:
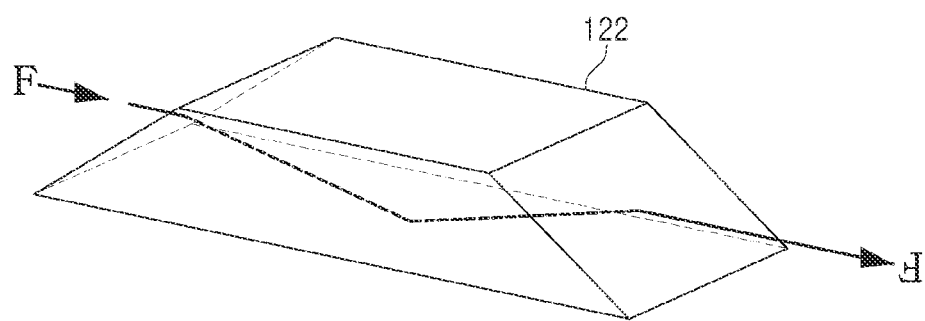
FIG. 5B is a view illustrating a dovetail prism according to an exemplary embodiment of the present inventive concept.
Figure 6A:
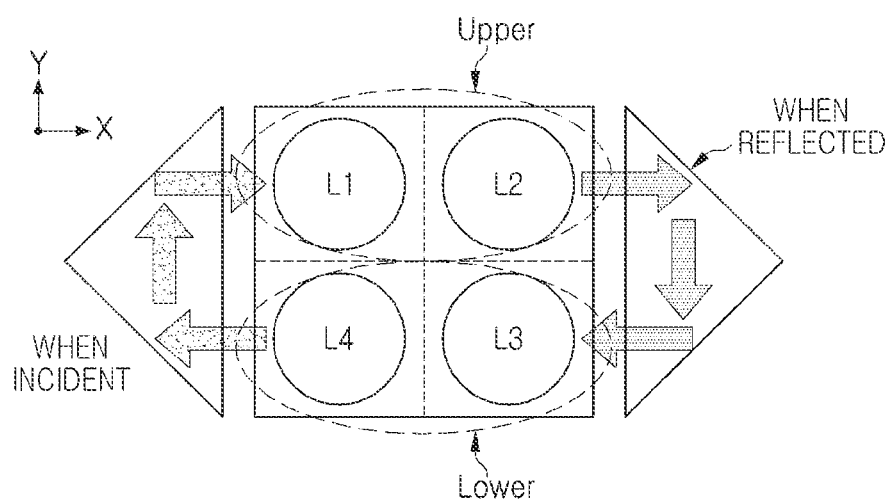
FIGS. 6A, 6B, 6C, and 6D are views illustrating a space split superimposing operation of a space split superimposing device 130 according to an exemplary embodiment of the present inventive concept.
Figure 6B:
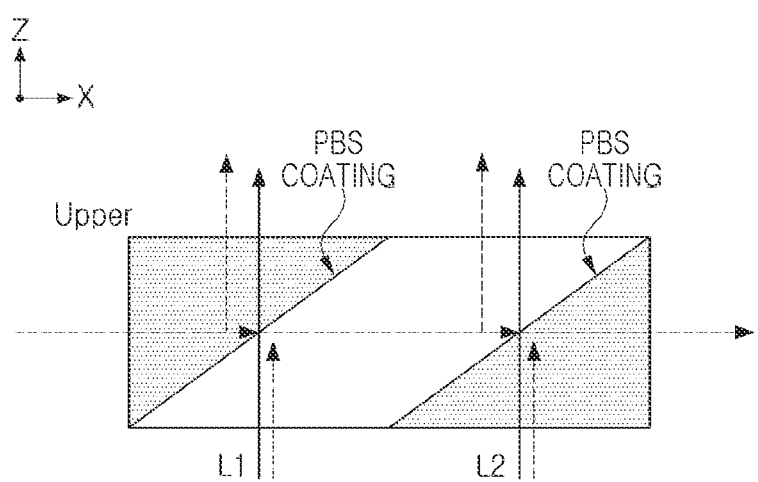
Figure 6C:
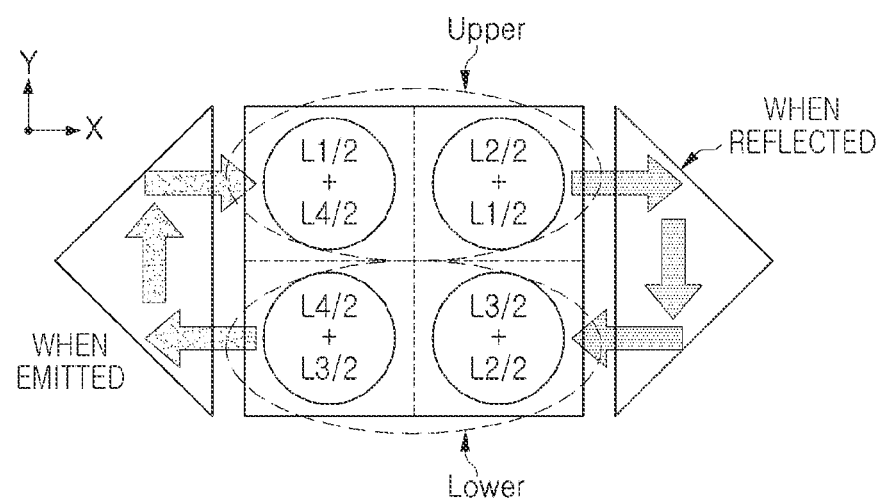
Figure 6D:
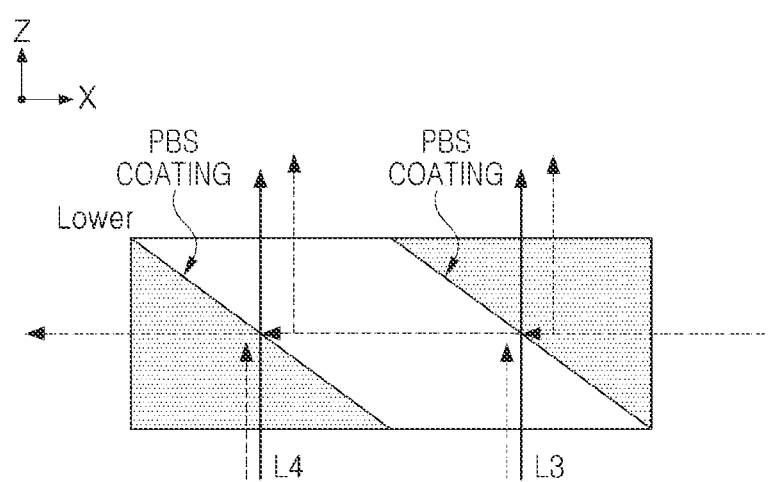

FIG. 5A is a view illustrating a beam movement effect by a beam splitter BS according to an exemplary embodiment of the present inventive concept, and FIG. 5B is a view illustrating a dovetail prism according to an exemplary embodiment of the present inventive concept. Referring to FIG. 5A, when a plate type beam splitter BS for high output is applied, a lateral shift of beams may occur due to a thickness t of the beam splitter BS. Therefore, in a conventional optical system, additional beam alignment may be required. In the present inventive concept, a window plate 121 having a thickness t, similar to that of the beam splitter BS, may be located in front of or behind the beam splitter BS, to compensate for a beam shift effect caused by the plate type beam splitter BS. Therefore, no additional optical alignment may be required. Referring to FIG. 5B, a dovetail prism 122 may be located between mirrors (e.g., between M1 and M2 and between M3 and M4). The dovetail prism 122 may superimpose beams in a state in which a cross-section thereof is inverted left/right sides and up/down sides. In this case, spatial coherency may be attenuated to more effectively reduce coherent noise.

FIGS. 6A, 6B, 6C, and 6D are views illustrating a space split superimposing operation of a space split superimposing device 130 according to an exemplary embodiment of the present inventive concept. In this case, a dotted line may be an S wave, a solid line may be a P wave, and a polarized beam splitter (PBS) coating may transmit the P wave, but reflect the S wave. Referring to FIGS. 6A, 6B, 6C, and 6D, in a space split superimposing method, when there are a plurality of lasers L1, L2, L3, and L4, a single pulse of each of the lasers may be spatially split to propagate a split pulse into different laser paths.

In an exemplary embodiment, beams may be spatially separated, but a beam path may be identical to an existing path. Beams emitted from different lasers may not interfere with each other. Beams emitted from different lasers but propagating into the same beam path may be in different states. As a result, an effective diameter of an optical system may not increase, but coherency may be reduced by an effect of increasing the number of lasers, to improve noise.

Figure 7A:
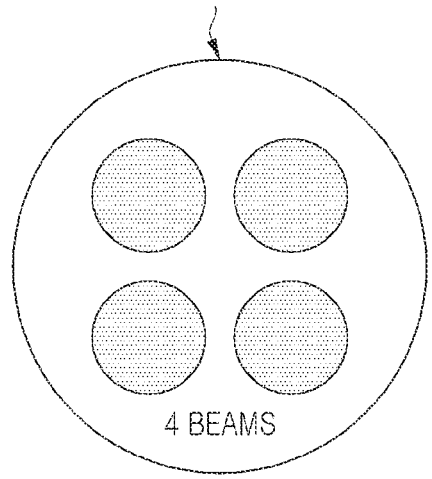
FIGS. 7A, 7B, and 7C are views illustrating an effective aperture of an optical system.
Figure 7B:
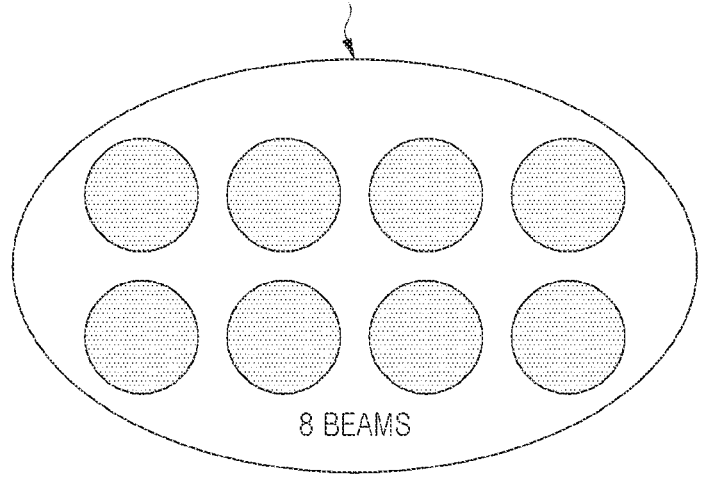
Figure 7C:
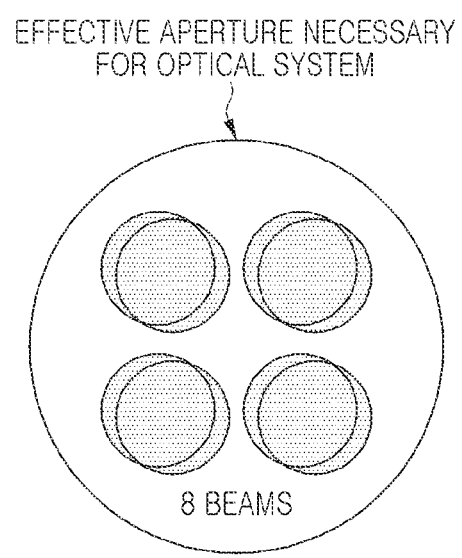

FIGS. 7A, 7B, and 7C are views illustrating an effective aperture of an optical system. Referring to FIG. 7A, an effective aperture including four original beams is illustrated. Referring to FIG. 7B, an effective aperture in which eight beams are superimposed, when the beams are spatially separated, is illustrated. Referring to FIG. 7C, an effective aperture in which eight beams are superimposed, when the beams are propagated into an existing path to be spatially separated, is illustrated.

Figure 8A:
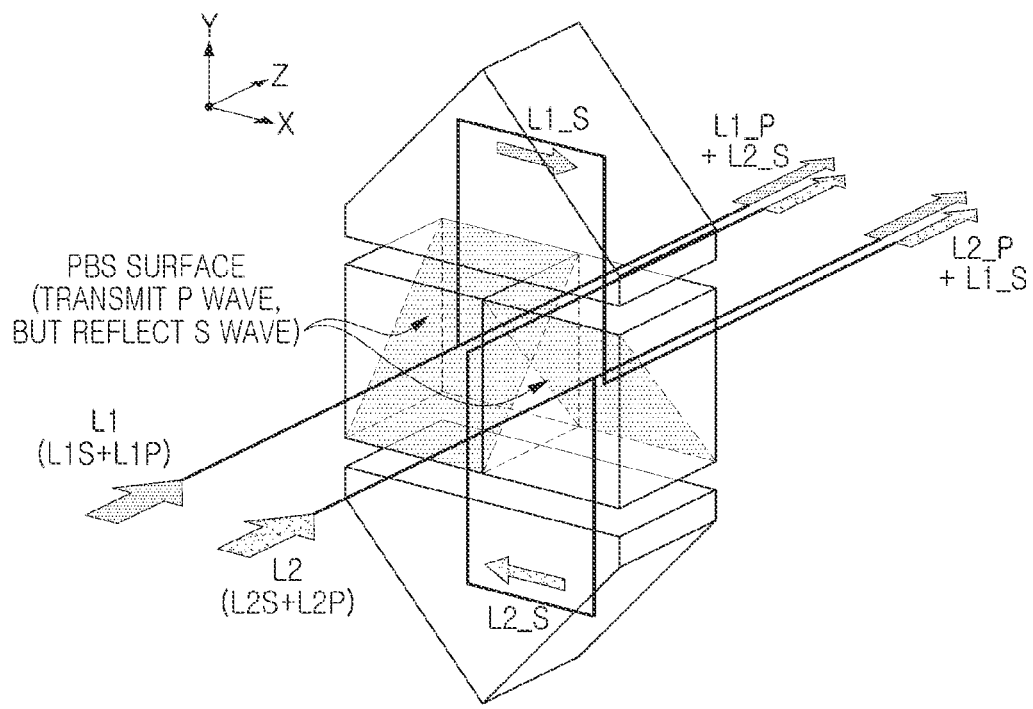
FIGS. 8A, 8B, 8C, and 8D are views illustrating an example of space splitting according to an exemplary embodiment of the present inventive concept.
Figure 8B:
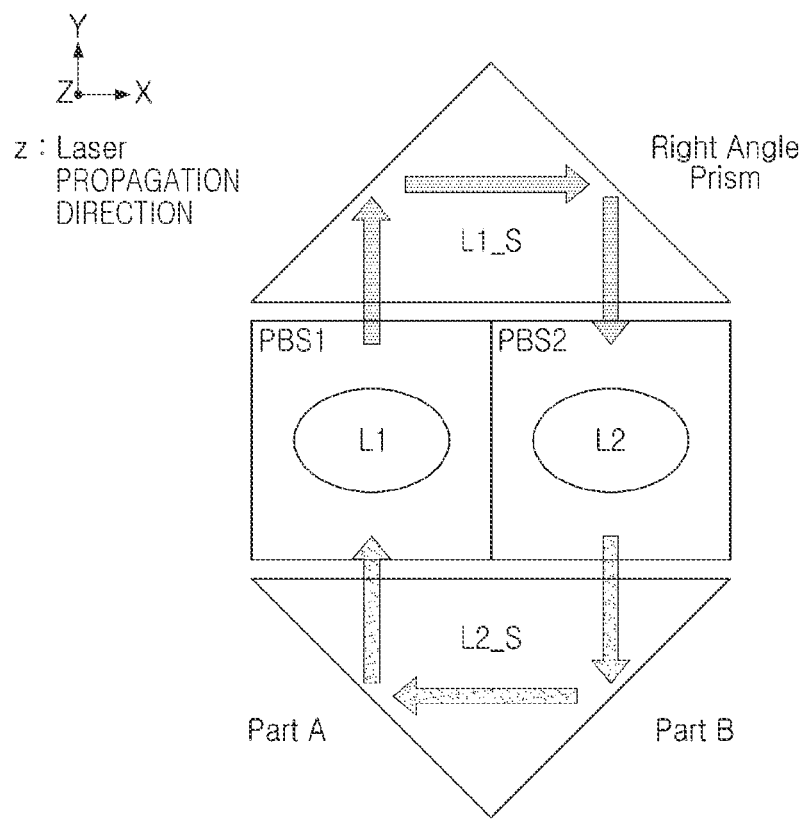
Figure 8C:
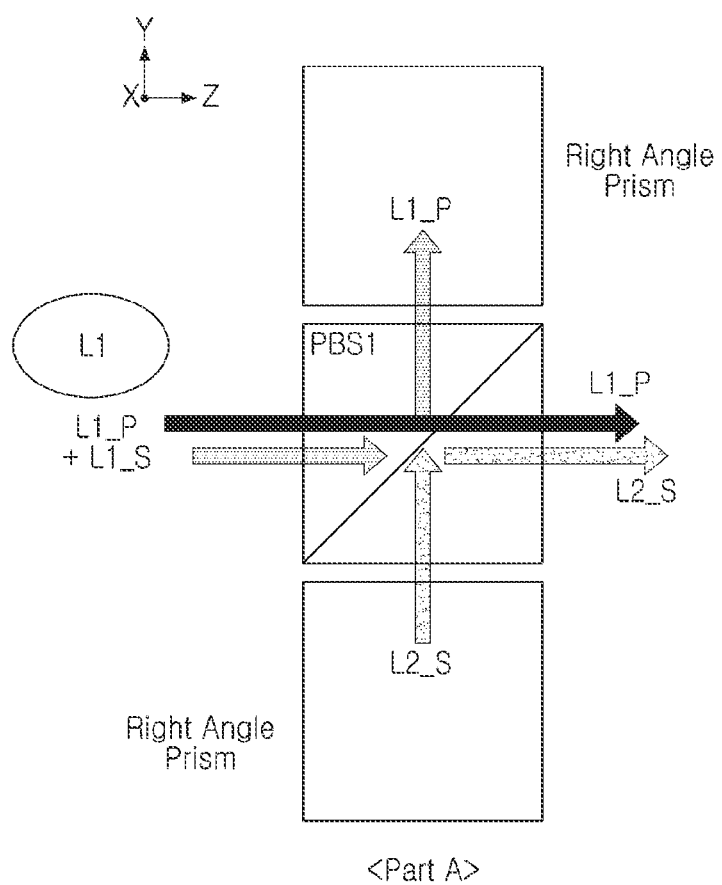
Figure 8D:
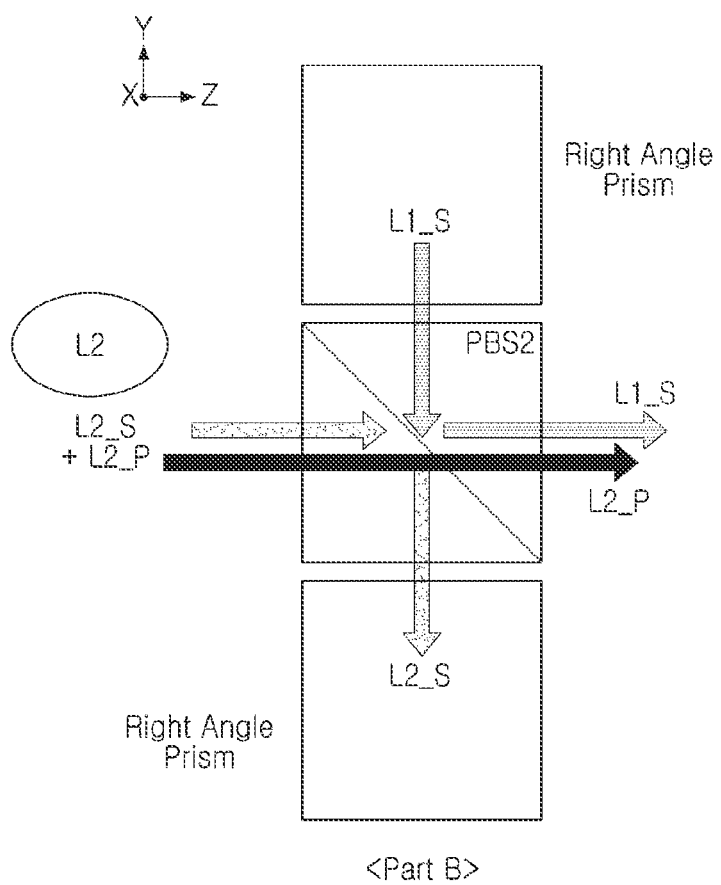

FIGS. 8A, 8B, 8C, and 8D are views illustrating an example of space splitting according to an exemplary embodiment of the present inventive concept. As illustrated in FIG. 8A, when two lasers L1 and L2 exist, a space split superimposing device 130 may be implemented with two polarizing beam splitters (PBS) and two right angle prisms. Referring to FIGS. 8B and 8C, in beams of a first laser L1, a P wave may be transmitted into an inclined surface of a first polarizing beam splitter PBS1, and an S wave may be reflected from the inclined surface of the first polarizing beam splitter PBS1, may pass through a right angle prism, may reach and be reflected from an inclined surface of a second polarization beam splitter PBS2, and may be propagated in a z direction. Referring to FIGS. 8B and 8D, in beams of a second laser L2, the P wave may be transmitted into the inclined surface of the second polarizing beam splitter PBS2, and the S wave may be reflected from the inclined surface of the second polarizing beam splitter PBS2, may pass through the right angle prism, may reach and be reflected from the inclined surface of the first polarizing beam splitter PBS1, and may be propagated in the z direction. As a result, the P wave of the first laser L1 and the S wave of the second laser L2 may be propagated onto the same path, and the P wave of the second laser L2 and the S wave of the first laser L1 may be also propagated onto the same path.

Figure 9A:
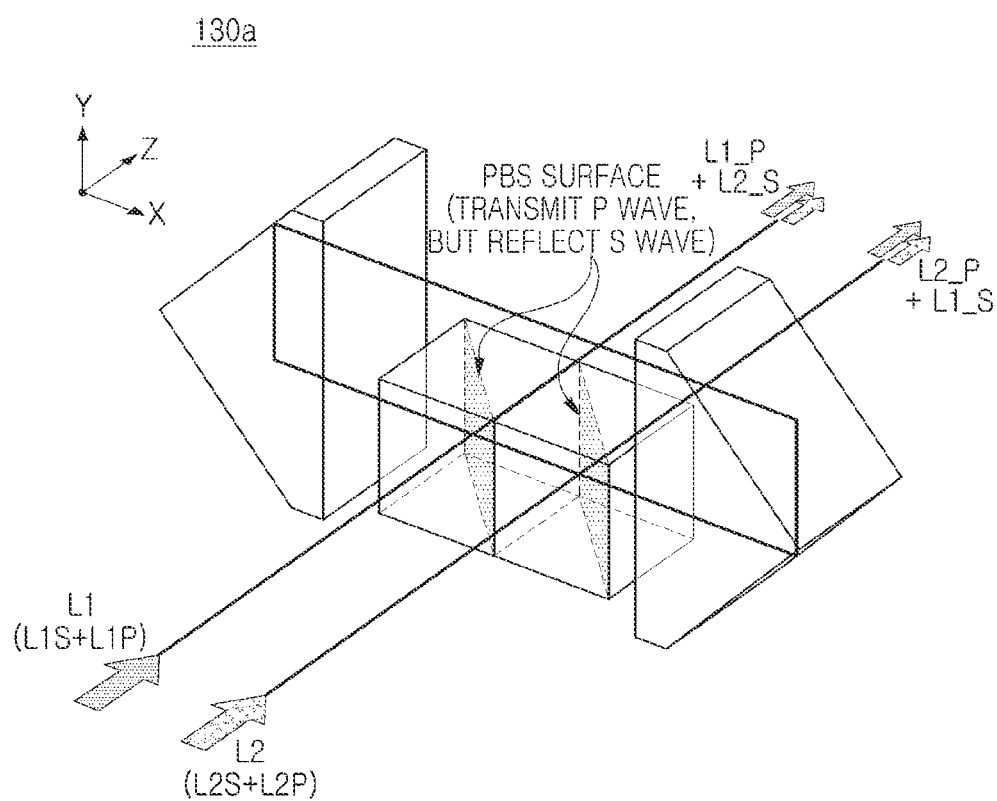
FIGS. 9A, 9B, and 9C are views illustrating another example of space splitting of a space split superimposing device 130a according to an exemplary embodiment of the present inventive concept.
Figure 9B:
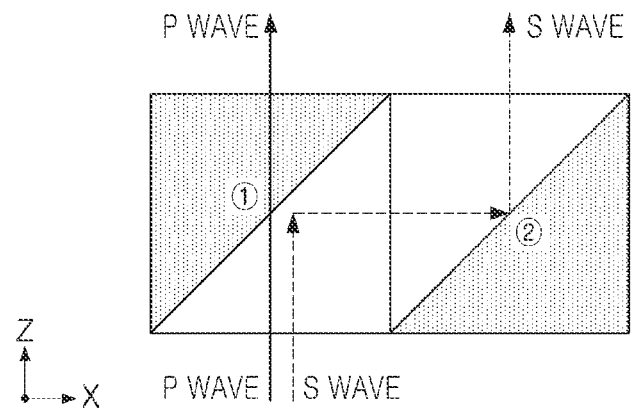
Figure 9C:
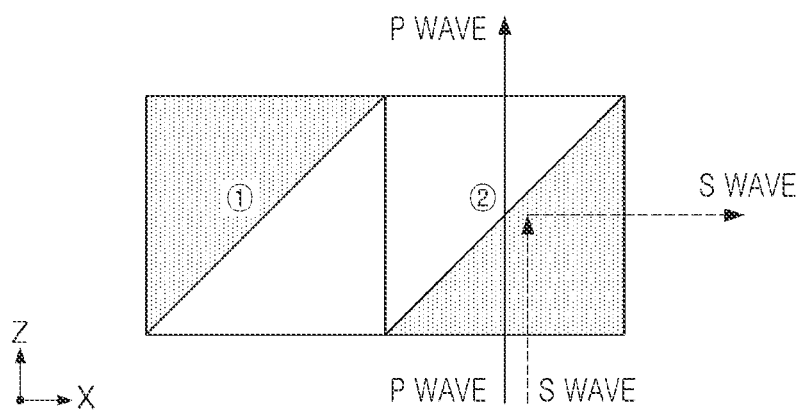

FIGS. 9A, 9B, and 9C are views illustrating another example of space splitting of a space split superimposing device 130a according to an exemplary embodiment of the present inventive concept. Referring to FIG. 9A, a space split superimposing device 130a may spatially split laser beams and may then superimpose the laser beams, using a module in which two PBS surfaces are combined and two right angle prisms. Referring to FIG. 9B, when beams are incident on a module in which two PBS surfaces are combined in a position of a first laser L1, a P wave may be transmitted into a ① inclined surface the inclined surface and may be propagated, and an S wave may be reflected from the ① inclined surface, may be reflected from a ② inclined surface, and may be propagated in the z direction. Referring to FIG. 9C, when beams are propagated in a position of a second laser L2, a P wave may be transmitted into a ② inclined surface and an S wave may be reflected from the ② inclined surface, to be propagated in the x direction. Reflected S wave may be passed through a prism, may be propagated onto the ① inclined surface, may be reflected from the ① inclined surface, and may be propagated in the z direction, like the P wave of the second laser L2.

Figure 10:
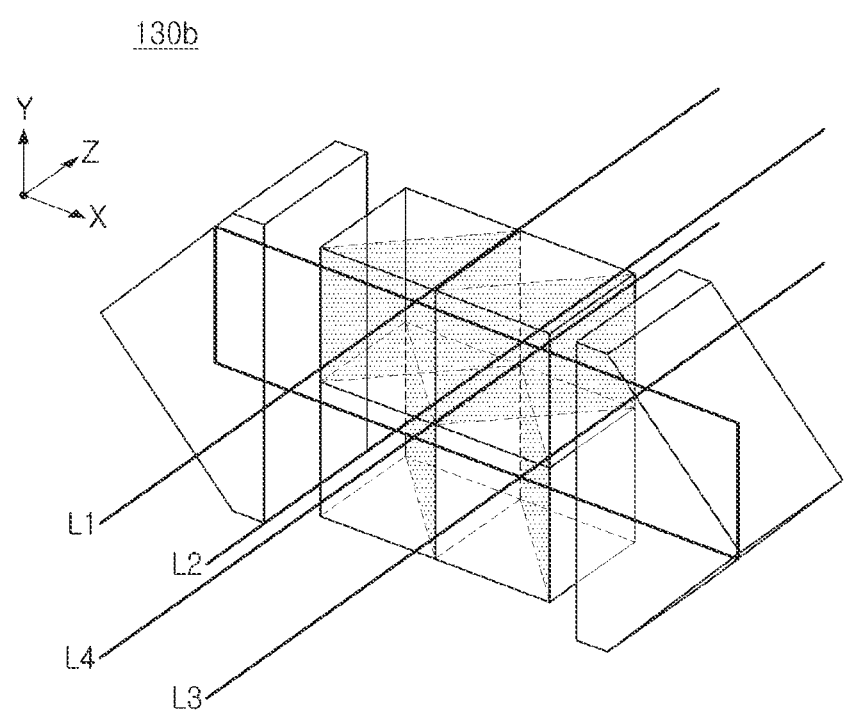
FIG. 10 is a view illustrating a space split superimposing device 130b according to yet another exemplary embodiment of the present inventive concept.

FIG. 10 is a view illustrating a space split superimposing device 130b according to another exemplary embodiment of the present inventive concept. Referring to FIG. 10, when four lasers L1, L2, L3, and L4 exist at the same time, a space split superimposing device 130b may be implemented with two modules combined with two PBS surfaces and two right angle prisms.

FIGS. 11A, 11B, 11C, and 11D are views illustrating a space splitting method of the space split superimposing device 130b of FIG. 10.

Figure 11A:
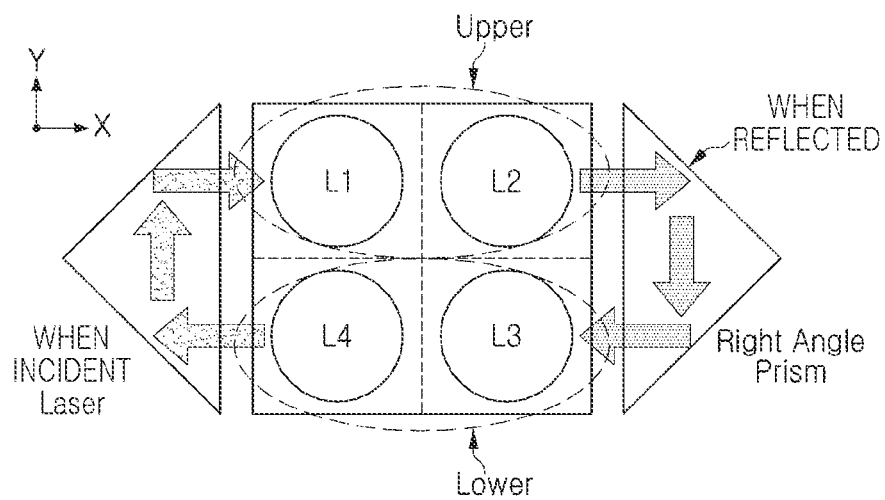
FIGS. 11A, 11B, 11C, and 11D are views illustrating a space splitting method of the space split superimposing device 130b of FIG. 10.

As illustrated in FIG. 11A, the four laser beams L1, L2, L3, and L4 may be incident between two right angle prisms (first and second prisms). First and second laser beams L1 and L2 may be incident on an upper portion, and the third and fourth laser beams L3 and L4 may be incident on a lower portion.

Figure 11B:
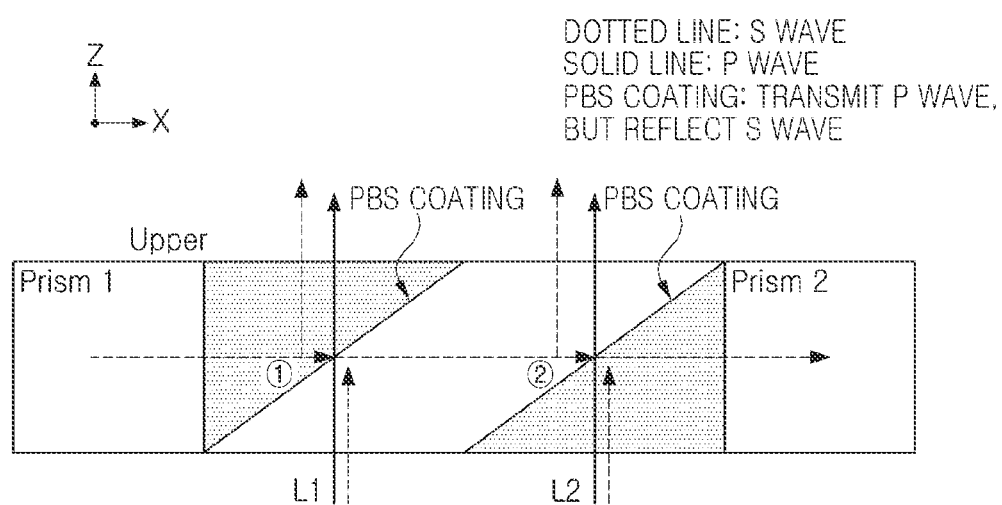

As illustrated in FIG. 11B, a P wave of the first laser beam L1 may be transmitted into and emitted from a first PBS surface ① disposed between the first and second prisms, and an S wave of the first laser beam L1 may be reflected from the first PBS surface ① and may be again reflected from and emitted from a second PBS surface ②). In addition, a P wave of the second laser beam L2 incident on the second PBS surface ② may be transmitted into the second PBS surface ②, may be superimposed with the S wave of the first laser beam L1, and may be emitted onto the same path. An S wave of the second laser beam L2 may be reflected and propagated in a direction facing the second prism, may be again reflected by the second prism, and may be reflected and emitted from a third PBS surface ③ in the lower portion.

Figure 11C:
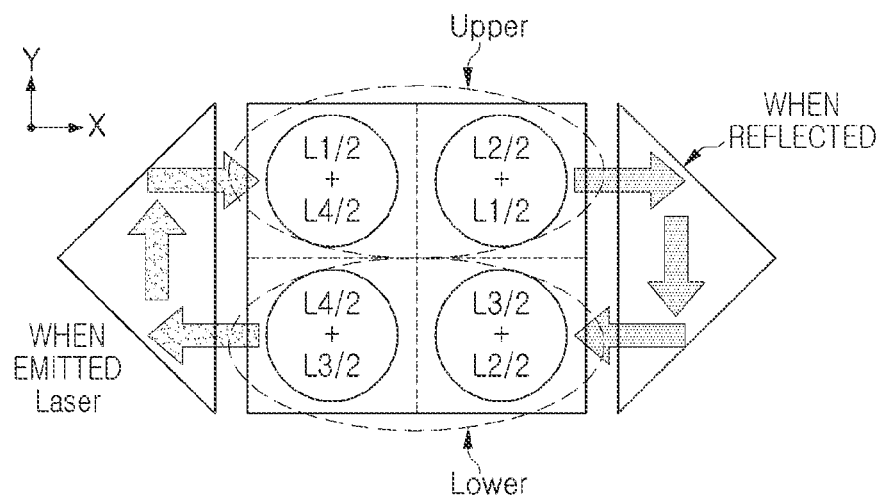
Figure 11D:
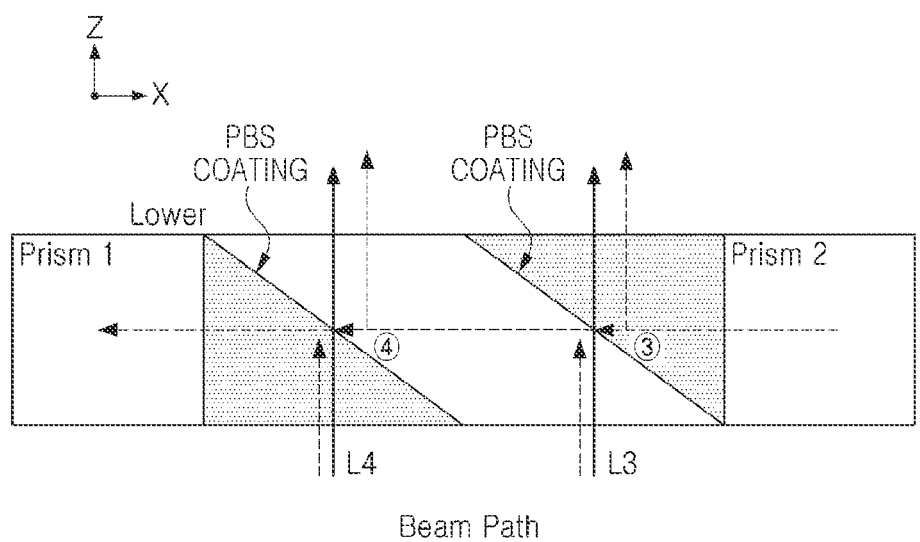

As illustrated in FIG. 11D, even in the third laser beam L3 incident on the third PBS surface ③, a P wave of the third laser beam L3 may be transmitted into the third PBS surface ③, may be superimposed with the S-wave of the second laser beam L2, and may be emitted onto the same path, and an S wave of the third laser beam L3 may be reflected from the third PBS surface ③, may be propagated onto a fourth PBS surface ④, and may be reflected from and emitted from the fourth PBS surface ④. In the fourth laser beam L4 incident on the fourth PBS surface ④, a P wave of the fourth laser beam L4 may be transmitted into the fourth PBS surface ④, may be superimposed with the S wave of the third laser beam L3, and may be emitted onto the same path. An S wave of the fourth laser beam L4 may be reflected from the fourth PBS surface ④, may be propagated in a direction facing the first prism, may be reflected from the first prism, may be reflected from the first PBS surface (①) in the upper portion, may be superimposed with the P wave of the first laser beam L1, and may be emitted onto the same path.

As illustrated in FIG. 11C, the four laser beams L1, L2, L3, and L4 may be emitted between the first and second prisms. Half (L1/2+L4/2) of each of the first and fourth laser beams in a first region may be emitted from the upper portion, and half (L2/2+L1/2) of each of the second and first laser beams in a second region may be emitted from the upper portion, half (L3/2+L2/2) of each of the third and second laser beams in a third region may be emitted from the lower portion, and half (L4/2+L3/2) of each of the fourth and third laser beams in a fourth region may be emitted from the lower portion.

Figure 12A:
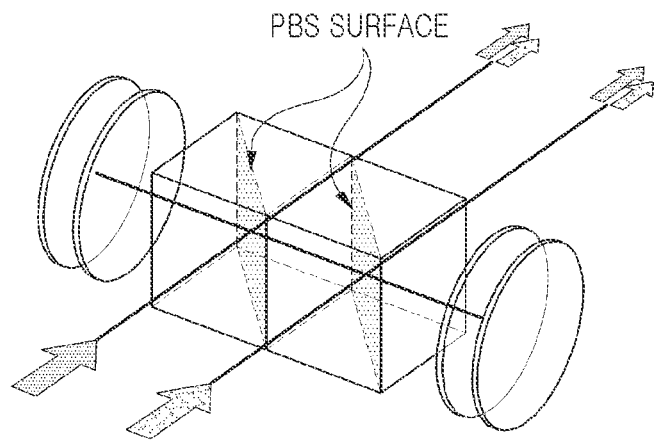
FIGS. 12A and 12B are views illustrating a space split superimposing device 130c according to another exemplary embodiment of the present inventive concept.
Figure 12B:
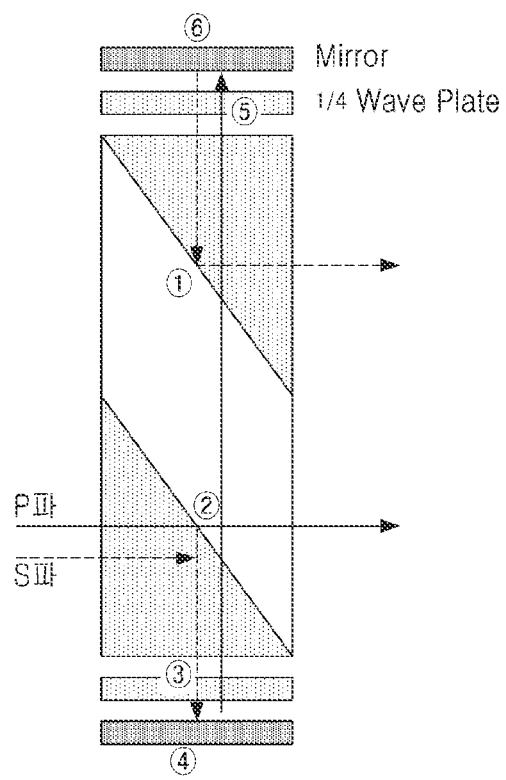

FIGS. 12A and 12B are views illustrating a space split superimposing device 130c according to another exemplary embodiment of the present inventive concept. Referring to FIG. 12A, a space split superimposing device 130c may be implemented with a ¼λ wave plate and a vertical reflection mirror, instead of a prism. As illustrated in FIG. 12B, a beam path may be formed to exhibit the same effect as other space split superimposing devices. In an exemplary embodiment, the space split superimposing device 130c may be used, even when four beams exist at the same time.

Figure 13:
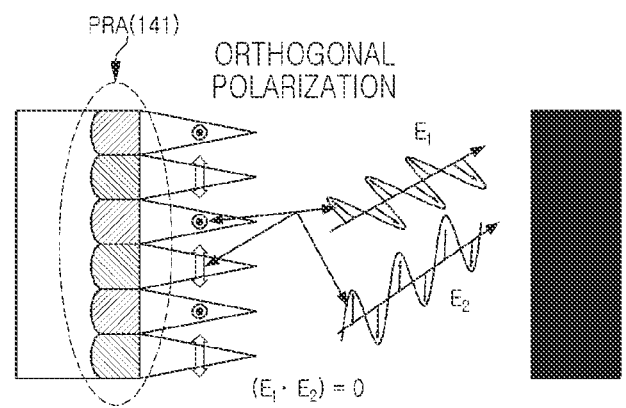
FIG. 13 is a view conceptually illustrating a polarization control method of a polarization controller 141 according to an exemplary embodiment of the present inventive concept.

FIG. 13 is a view conceptually illustrating a polarization control method of a polarization controller 141 according to an exemplary embodiment of the present inventive concept. Polarization of a beam refers to an oscillation direction of an electric field. Beams emitted from most light sources may be non-polarized. When beams pass through a linear polarizer, only waves in which an electric field vector oscillates in a specific direction may be produced. In this manner, an electric field in which the electric field vector of the beams oscillates only in the specific direction is referred to as linear polarization. Most laser beams may have linear polarization characteristics propagating in a straight direction while oscillating in only one direction. In general, an interference fringe may occur when light of the same polarization state meets. When polarization directions are orthogonal to each other, since (E1·E2)=0, an interference fringe may not occur.

Figure 14A:
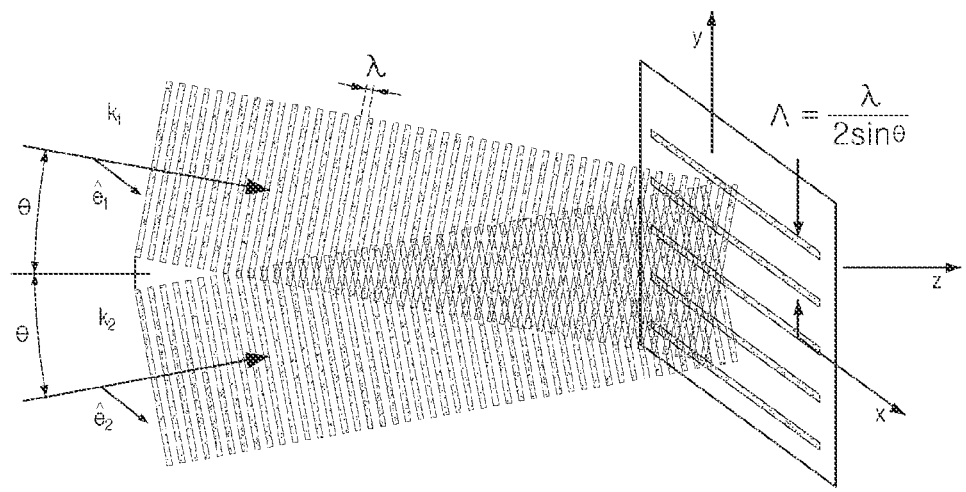
FIGS. 14A, 14B, 14C, 14D, and 14E are views illustrating a method of improving noise through polarization control.
Figure 14B:
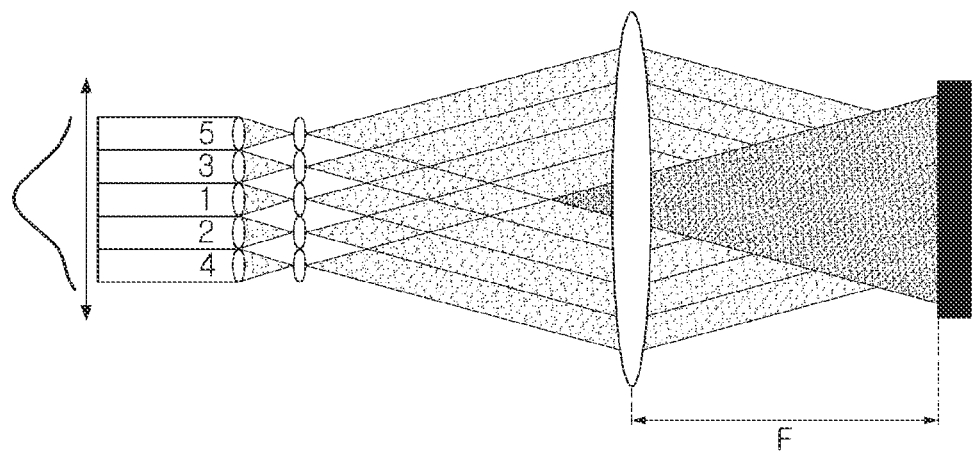
Figure 14C:
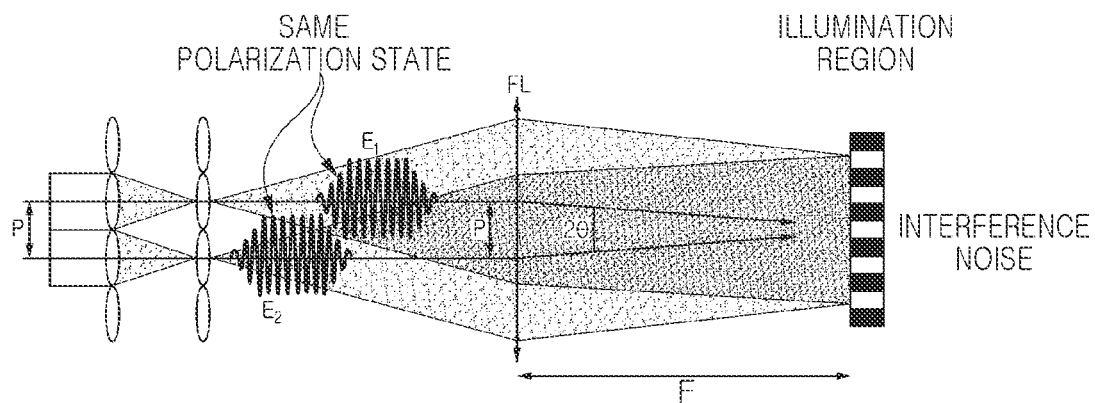
Figure 14D:
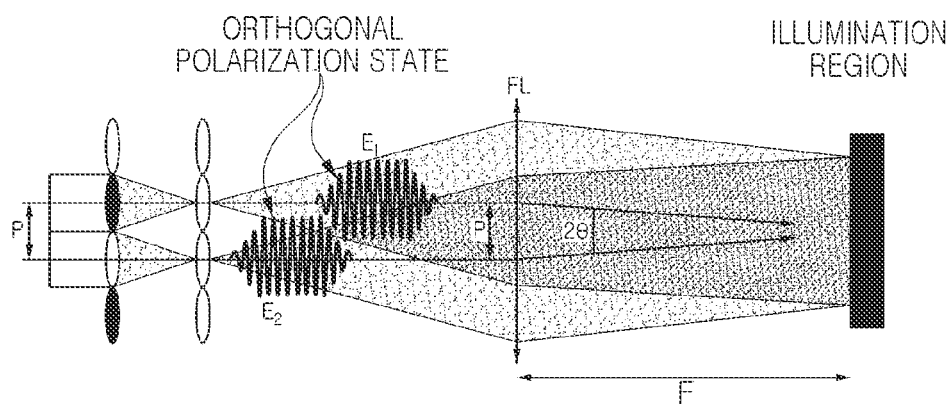
Figure 14E:
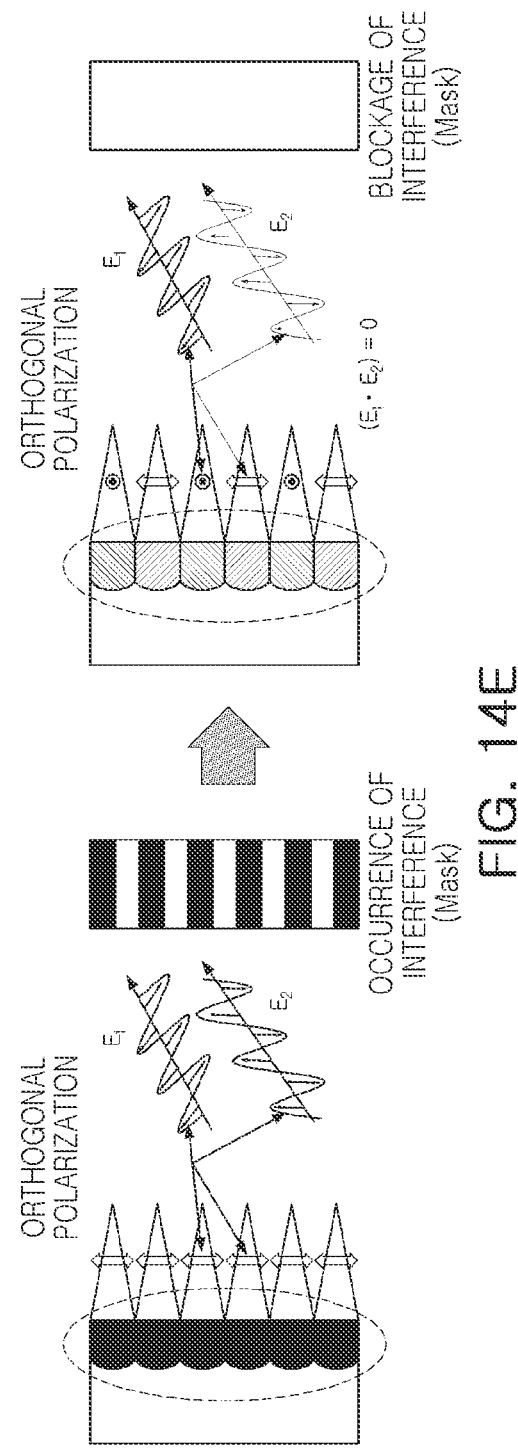

FIGS. 14A, 14B, 14C, 14D, and 14E are views illustrating a method of improving noise through polarization control. As illustrated in FIG. 14A, a principle in which two beams interfere and a principle of the homogenizer of FIG. 14B may be combined, such that polarization states of adjacent beams are orthogonal to each other by fly eye lenses in an optical illumination system, as illustrated in FIG. 14D, to remove noise due to interference in an illumination region of a conventional fly eye lens illustrated in FIG. 14C. As illustrated in FIG. 14E, interference may occur when beams passing through a fly eye lens are the same polarization, but interference may be blocked when the beams passing through the fly eye lens are orthogonally polarized.

Figure 15A:
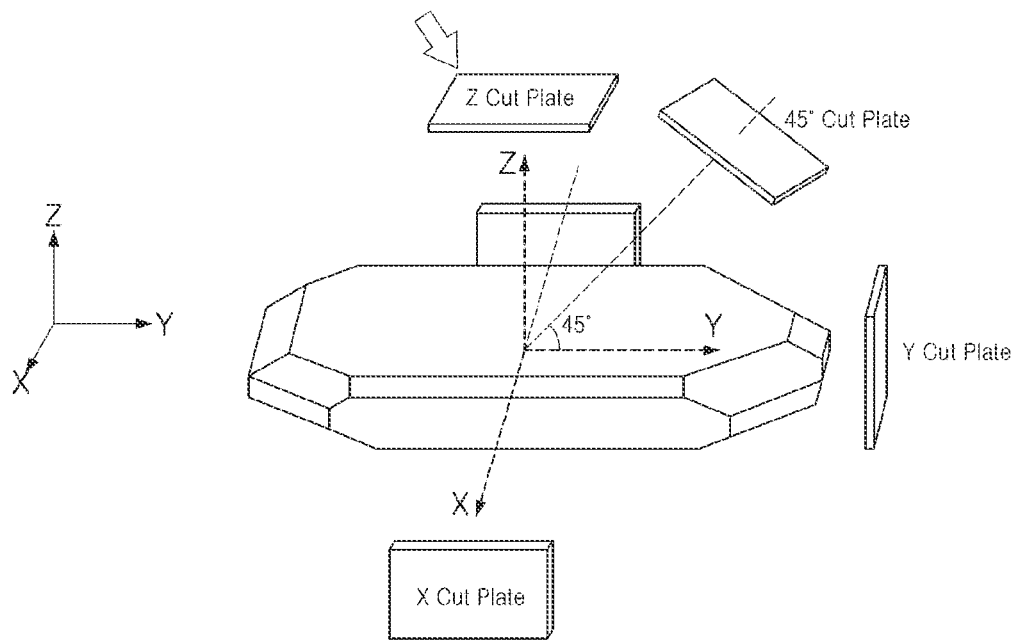
FIGS. 15A, 15B, 15C, and 15D are views illustrating how optical characteristics change according to a cut direction of single crystal quartz.
Figure 15B:
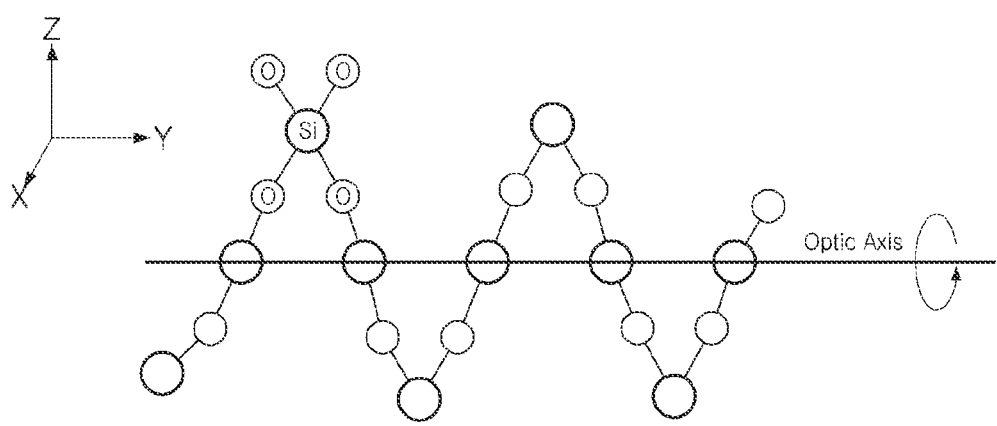
Figure 15C:
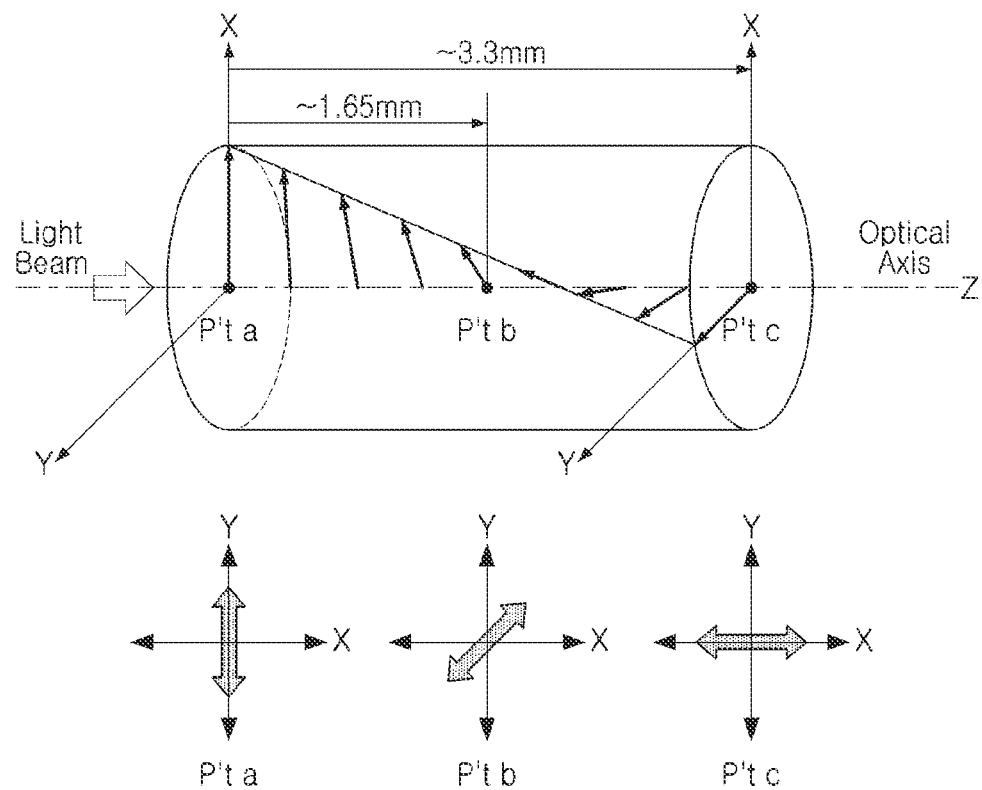
Figure 15D:
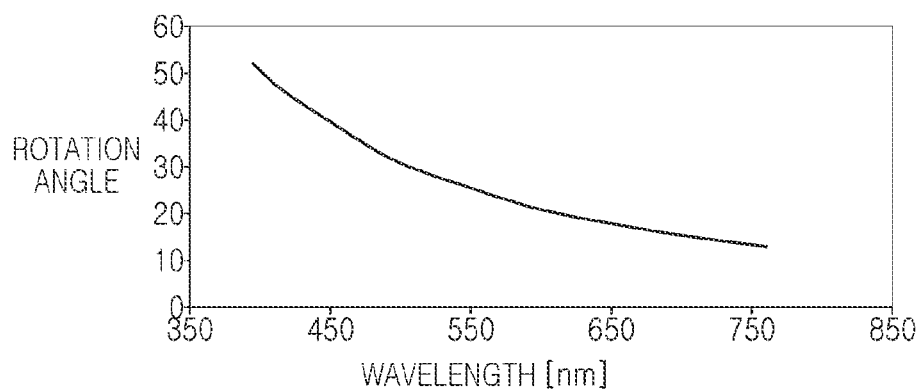

FIGS. 15A, 15B, 15C, and 15D are views illustrating that optical characteristics change according to a cut direction of single crystal quartz. Referring to FIG. 15A, optical characteristics may vary according to a cut direction of single crystal quartz. As illustrated in FIG. 15B, in a Z-cut crystal quartz cut to be perpendicular to an optical axis, a crystal internal molecular structure may be twisted, like a spring, in the z-direction (in the optical axis). As illustrated in FIG. 15C, when a beam in a linearly polarized state is incident parallel to the optical axis due to this internal molecular structure, a polarization direction may rotate and proceed along the molecular structure. The characteristics may be referred to as optical activities. As illustrated in FIG. 15D, when a thickness changes by 1 mm, a rotation angle of polarized light may be expressed as a specific rotatory power 'α [degree/mm].' When light having a wavelength of 532 nm passes through Z-cut crystal quartz having a thickness of about 1.65 mm, linearly polarized light may be rotated by 45 degrees. When light having a wavelength of 532 nm passes through Z-cut crystal quartz having a thickness of about 3.3 mm, linearly polarized light may be rotated by 90 degrees.

Figure 16:
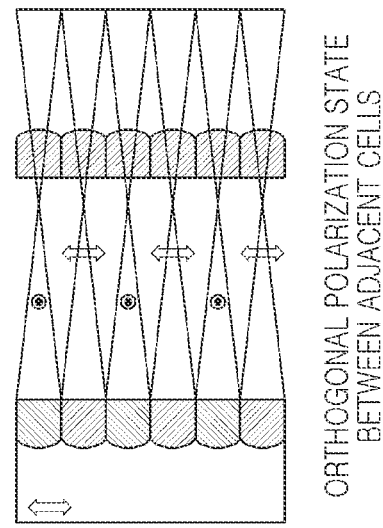
FIG. 16 is a view illustrating a method of making an orthogonal state between adjacent cells of beams passing through a fly eye lens array according to an exemplary embodiment of the present inventive concept.
Figure 16:
Figure 16:
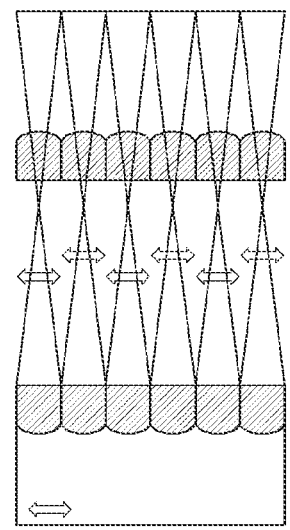
Figure 16:
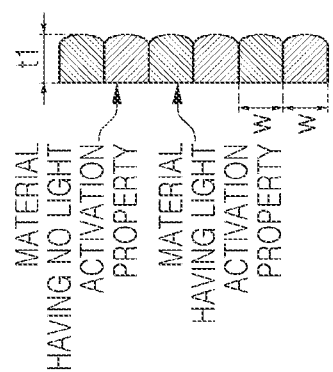

FIG. 16 is a view illustrating a method of making an orthogonal state between adjacent cells of beams passing through a fly eye lens array (FLA) according to an exemplary embodiment of the present inventive concept. Z-cut crystal quartz having a light activation property that may rotate a linear polarization state by 90 degrees, may be manufactured to form a fly eye lens array (having a thickness that may be rotated by 90 degrees) used in an existing optical illumination homogenizer, and may be combined with a fly eye lens made of a material without a light activation property, to be orthogonal to each other between adjacent cells of beams passing through the fly eye lens.

In an exemplary embodiment, the fly eye lens array (FLA) may include a first fly eye lens array made of a material having no light activation property, and a second fly eye lens array configured by intersecting a material having a light activation property and a material having no light activation property. In an exemplary embodiment, the first fly eye lens array and the second fly eye lens array may be disposed to oppose each other.

FIGS. 17A, 17B, 17C, and 17D are views illustrating examples of arrangement of a polarization controller according to an exemplary embodiment of the present inventive concept. The same effect may be expected when located to correspond to an existing fly eye lens array by intersecting a material having a light activation property and a material having no light activation property.

Figure 17A:
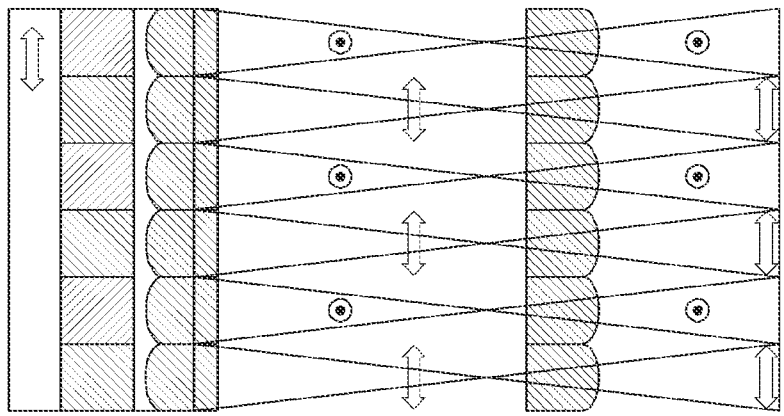
FIGS. 17A, 17B, 17C, and 17D are views illustrating examples of arrangement of a polarization controller according to an exemplary embodiment of the present inventive concept.
Figure 17B:
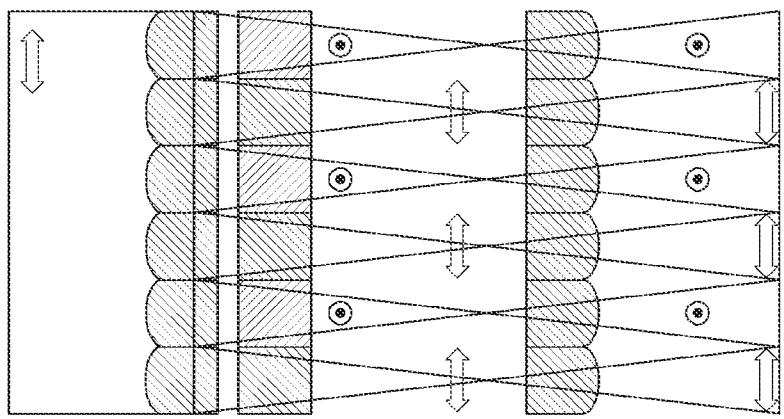

As illustrated in FIG. 17A, when an edge of a polarization control element and an edge of a fly eye lens do not exactly match, there may be a problem of impairing uniformity of an edge portion of an illumination region. As illustrated in FIG. 17B, since beams discretized in a fly eye lens are converging, it is not necessary to consider a negative effect on diffraction at an edge of a polarization control element. In a structure using a high power pulse laser and telecentric imaging optics in which beams are shaped by a mask, it is necessary to locate the imaging optics to avoid a focus position by beams reflected back by a wafer. As illustrated in FIG. 17B, telecentricity (e1) of an optical illumination system and telecentricity (e2) of an optical imaging system may be measured or calculated, to find a back focus position of the beams reflected back from the wafer, and there is no need for the imaging optics to be installed to avoid a surface of the polarization control element in the position.

Figure 17C:
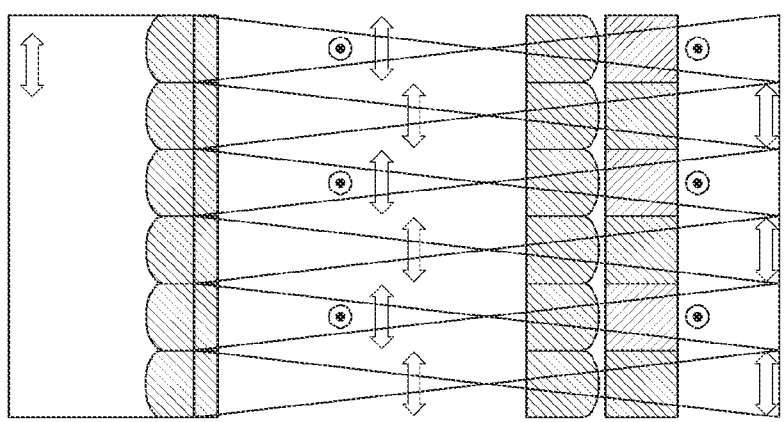
Figure 17D:
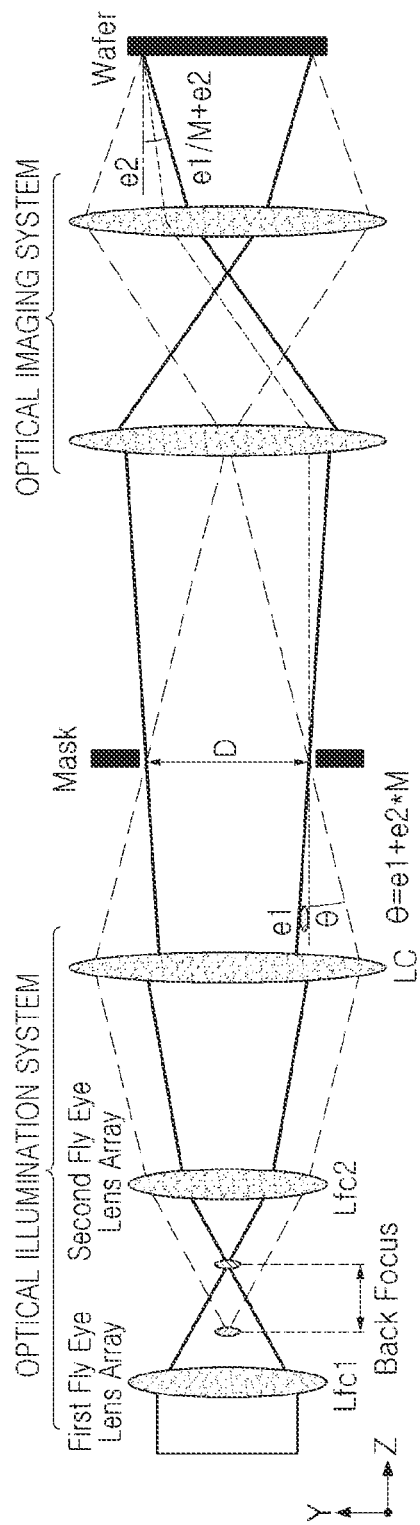

As illustrated in FIG. 17C, since beams focused by a fly eye lens are in a state of divergence, but are in a state in which they do not coincide at an edge of an array, the negative effect of diffraction may be ignored and a focusing position of reflected beams may be avoided.

In an exemplary embodiment, at least one fly eye lens array may include a first fly eye lens array, a second fly eye lens array corresponding to the first fly eye lens array, and a polarization controller disposed on any one of a front end of the first fly eye lens array, a rear end of the first fly eye lens array, and a rear end of the second fly eye lens array. In such case, the polarization controller may be implemented such that polarization states of beams of adjacent cells passing through the first or second fly eye lens array are orthogonal to each other.

Figure 18:
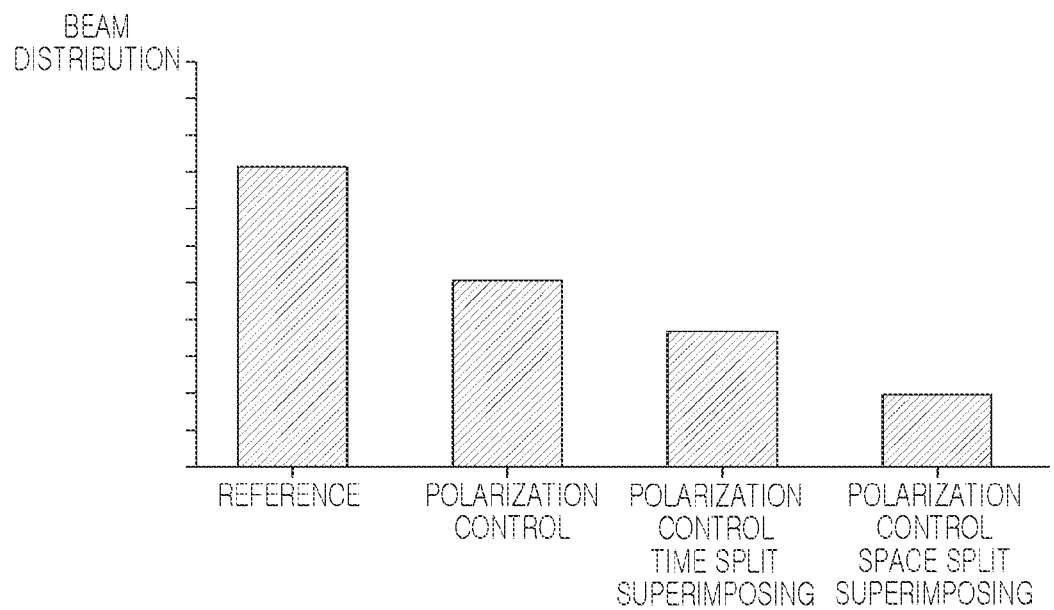
FIG. 18 is a view illustrating an effect of improving beam distribution of an apparatus for laser annealing according to an exemplary embodiment of the present inventive concept.

FIG. 18 is a view illustrating an effect of improving beam distribution of an apparatus for laser annealing according to an exemplary embodiment of the present inventive concept. Currently, in a wafer melting annealing process using an ns pulse laser, beam distribution deterioration may occur due to noise caused by coherency, which may be the cause of defects in product development. It has been confirmed that actual beam distribution is improved by application of elements of the present inventive concept, and it has also been confirmed that beam distribution-derived defects have been reduced, resulting in improved results.

Figure 19:
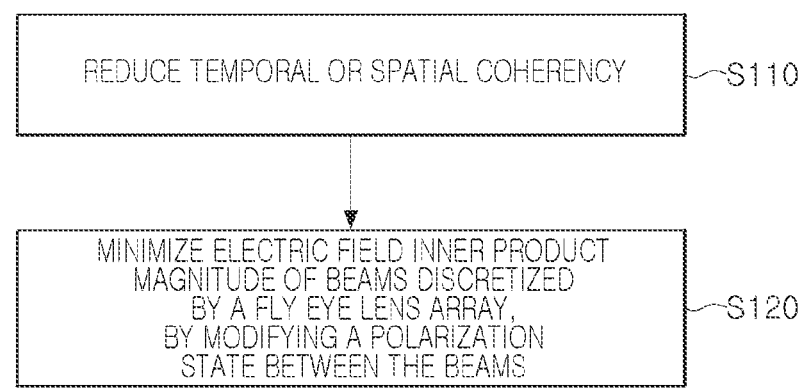
FIG. 19 is a flowchart illustrating a method of operating an apparatus for laser annealing according to an exemplary embodiment of the present inventive concept.

FIG. 19 is a flowchart illustrating a method of operating an apparatus for laser annealing according to an exemplary embodiment of the present inventive concept. Referring to FIGS. 1 to 19, a method of operating an apparatus 100 for laser annealing may proceed as described below.

An apparatus 100 for laser annealing may improve coherency noise by reducing coherency by time/space split superimposing of ns pulse lasers (S110). In addition, the apparatus 100 may control polarization states to suppress occurrence of interference (S120). In this manner, it is possible to improve noise caused by interference by making an electric field inner product magnitude of adjacent beams zero (0).

In an exemplary embodiment, reducing temporal or spatial coherency may include reducing temporal coherency of beams by a time division superimposing device, and reducing spatial coherency of beams by a space split superimposing device. In an exemplary embodiment, reducing an electric field inner product magnitude of beams may include making beams transmitted in adjacent cells of a fly eye lens array to be orthogonal to each other. In an exemplary embodiment, one of the adjacent cells may be a material having no light activation property, and the other of the adjacent cells may be a material having a light activation property. In an exemplary embodiment, the fly eye lens array may include a first fly eye lens array made of a material having no light activation property, and a second fly eye lens array configured by intersecting a material having a light activation property and a material having no light activation property.

An apparatus for laser annealing according to an exemplary embodiment of the present inventive concept may include a laser light source, a fly eye lens optical illumination system, a mask, an optical imaging system, a pulse space split superimposing device, a pulse time division superimposing device, a beam polarization controller, reducing speckle noise due to coherency within a single pulse of a pulse laser.

In an exemplary embodiment, the pulse time division superimposing device may temporally branch pulses, respectively, to propagate branched pulses into different optical paths, and may superimpose each of the pulses, to reduce coherent noise. In an exemplary embodiment, the pulse space split superimposing device may spatially branch laser pulses under conditions of using a plurality of pulse lasers, respectively, and may superimpose branched laser pulses to propagate superimposed laser pulses onto the same path as different laser pulses, to reduce coherent noise. In an exemplary embodiment, the beam polarization controller may use a fly eye lens of an optical illumination system made of a Z-cut crystal quartz having a light activation property, and may make polarization states of beams passing through the fly eye lens orthogonal to each other, to reduce coherent noise.

A general apparatus for laser annealing may make an optical path difference (OPD) of beams passing through a fly eye lens to be different by more than a temporal coherency length (~mm) in an optical illumination system, but may have weak speckle noise even in the OPD, equal to or greater than an actual temporal coherency length. In this case, OPD of a meter (m) unit level may be required, giving rise to problems that make it difficult to implement in an optical system in practice. An apparatus for laser annealing according to an exemplary embodiment of the present inventive concept may reduce coherency by time/space split superimposing of ns pulse lasers and control polarization states to suppress occurrence of interference, to improve noise caused by coherency.

An apparatus for laser annealing and an operating method thereof according to an exemplary embodiment of the present inventive concept may superimpose beams using a temporal/spatial splitting method, or control polarization state of beams passing through adjacent cells of an illumination system fly eye lens, to significantly reduce noise according to beam coherency.

While exemplary embodiments have been illustrated and described above, it will be apparent to those skilled in the art that many modifications and variations could be made without departing from the scope of the present inventive concept as defined by the appended claims.

What is claimed is:

1. An apparatus for laser annealing comprising:
   a light source configured to generate a plurality of laser beams;
   a time division superimposing device comprising at least one beam splitter configured to temporally branch the plurality of laser beams, respectively, to propagate branched beams onto different optical paths, and wherein the time division superimposing device is configured to superimpose beams emitted from the same laser, from the branched beams propagated onto different optical paths;
   a space split superimposing device comprising
      at least one beam splitter configured to spatially branch superimposed beams from the time division superimposing device, respectively, and
      at least one reflector configured to propagate beams emitted from different lasers onto the same path, to superimpose the propagated beams emitted from the plurality of lasers beams;
   an optical illumination system comprising a plurality of lenses configured to form flat-top beams homogenizing intensities of superimposed beams from the space split superimposing device;
   a mask configured to pass homogenized beams from the flat-top beams formed by passing through the optical illumination system; and
   an optical imaging system comprising a plurality of lenses configured to image each of the homogenized beams passing through the mask onto a wafer.

2. The apparatus of claim 1, wherein the optical illumination system comprises:
   at least one fly eye lens array configured to discretize the superimposed beams passing through the space split superimposing device; and
   a polarization controller configured to make polarization states of beams from adjacent lenses of the at least one fly eye lens array orthogonal to each other.

3. The apparatus of claim 1, wherein the at least one beam splitter of the time division superimposing device comprises:
   a first beam splitter configured to reflect a first laser beam of the plurality of laser beams with a first reflectance and to transmit the first laser beam with a first transmittance; and
   a plurality of mirrors configured to reflect beams reflected by the first beam splitter and to propagate the beams into the first beam splitter.

4. The apparatus of claim 3, wherein the plurality of mirrors comprises:
   a first mirror configured to reflect the beams reflected by the first beam splitter in a first direction;

a second mirror configured to reflect beams reflected by the first mirror in a second direction;

a third mirror configured to reflect beams reflected by the second mirror in a direction opposite to the first direction; and a fourth mirror configured to reflect beams reflected by the third mirror in a direction opposite to the second direction to propagate the beams into the first beam splitter.

5. The apparatus of claim 3, wherein the time division superimposing device further comprises a window plate located on a front end of the first beam splitter, and having a thickness corresponding to a thickness of the first beam splitter.

6. The apparatus of claim 3, wherein the time division superimposing device further comprises a dovetail prism configured to superimpose cross-sections of the beams between the plurality of mirrors to a state of inverted left/right sides and up/down sides.

7. The apparatus of claim 1, wherein the space split superimposing device comprises:

at least one right angle prism configured to propagate beams in a right direction; and wherein the at least one beam splitter of the space split superimposing device comprises a plurality of polarizing beam splitters configured to transmit P-waves and to reflect S-waves on an inclined surface, wherein the at least one right angle prism is configured propagate beams in the space split superimposing device between different polarizing beam splitters of the plurality of polarizing beam splitters.

8. The apparatus of claim 1, wherein the space split superimposing device comprises:

a quarter wave plate; and a vertical reflection mirror, wherein the at least one beam splitter of the space split superimposing device comprises at least one polarizing beam splitter configured to transmit P-waves and to reflect S-waves on an inclined surface, and wherein the vertical reflection mirror is configured to vertically reflect beams from the at least one polarizing beam splitter and transmitted through the quarter wave plate back to the at least one polarizing beam splitter.

9. The apparatus of claim 1, wherein the optical illumination system comprises at least one fly eye lens array configured to discretize the beams passing through the space split superimposing device, wherein the at least one fly eye lens is configured by intersecting a material having a light activation property and a material having no light activation property.

10. The apparatus of claim 9, wherein the at least one fly eye lens array comprises:

a first fly eye lens array; and a second fly eye lens array corresponding to the first fly eye lens array, wherein the apparatus further comprises a polarization controller disposed on any one of a front end of the first fly eye lens array, a rear end of the first fly eye lens array, and a rear end of the second fly eye lens array, and configured to make polarization states of adjacent beams passing through the first fly eye lens array or the second fly eye lens array orthogonal to each other.

* * * * *